United States Patent
Costa

(10) Patent No.: US 12,407,326 B2
(45) Date of Patent: Sep. 2, 2025

(54) STACKED DIE TRANSVERSELY-EXCITED FILM BULK ACOUSTIC RESONATOR (XBAR) FILTERS

(71) Applicant: Murata Manufacturing Co., Ltd., Nagaokakyo (JP)

(72) Inventor: James R. Costa, Grass Valley, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 312 days.

(21) Appl. No.: 17/902,616

(22) Filed: Sep. 2, 2022

(65) Prior Publication Data

US 2023/0134889 A1 May 4, 2023

Related U.S. Application Data

(60) Provisional application No. 63/275,870, filed on Nov. 4, 2021.

(51) Int. Cl.
| | |
|---|---|
| H03H 9/56 | (2006.01) |
| H03H 3/02 | (2006.01) |
| H03H 9/13 | (2006.01) |
| H03H 9/17 | (2006.01) |

(52) U.S. Cl.
CPC .............. *H03H 9/564* (2013.01); *H03H 3/02* (2013.01); *H03H 9/133* (2013.01); *H03H 9/173* (2013.01); *H03H 9/568* (2013.01); *H03H 2003/021* (2013.01)

(58) Field of Classification Search
CPC .. H03H 9/564; H03H 9/0547; H03H 9/02228; H03H 3/02; H03H 9/173; H03H 9/568; H03H 9/174; H03H 9/133; H03H 2003/021; H03H 2003/023
See application file for complete search history.

(56) References Cited

U.S. PATENT DOCUMENTS

| | | | |
|---|---|---|---|
| 5,204,575 | A | 4/1993 | Kanda et al. |
| 5,274,345 | A | 12/1993 | Gau |
| 5,446,330 | A | 8/1995 | Eda et al. |
| 5,552,655 | A | 9/1996 | Stokes et al. |
| 5,726,610 | A | 3/1998 | Motorola |
| 5,729,186 | A | 3/1998 | Seki et al. |

(Continued)

FOREIGN PATENT DOCUMENTS

| | | | | |
|---|---|---|---|---|
| EP | 4087126 A1 | 11/2022 | | |
| WO | WO-2006008940 A1 * | 1/2006 | ......... | B81C 1/00238 |

(Continued)

OTHER PUBLICATIONS

Internation Search Report and Written Opinion in PCT/US2022/079236, mailed Mar. 10, 2023, 22 pages.

(Continued)

*Primary Examiner* — Quan Tra
(74) *Attorney, Agent, or Firm* — Arent Fox Schiff LLP

(57) ABSTRACT

A stacked die XBAR filter device includes a first die containing one or more XBARs on a first surface, a second die containing one or more XBARs on a second surface, and one or more conductive vias through either the first die or the second die, where the first die is connected to the second die with the first surface facing the second surface.

19 Claims, 20 Drawing Sheets

©2022 RESONANT INC.

(56) References Cited

U.S. PATENT DOCUMENTS

| | | |
|---|---|---|
| 5,853,601 A | 12/1998 | Krishaswamy |
| 5,952,899 A | 9/1999 | Kadota et al. |
| 6,172,582 B1 | 1/2001 | Hickernell |
| 6,271,617 B1 | 8/2001 | Yoneda et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 7,009,468 B2 | 3/2006 | Kadota et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,476,469 B2 | 11/2019 | Gong et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 11,201,601 B2 | 12/2021 | Yantchev et al. |
| 11,206,009 B2 | 12/2021 | Plesski |
| 11,228,296 B2 | 1/2022 | Dyer |
| 11,239,816 B1 | 2/2022 | McHugh |
| 11,239,822 B2 | 2/2022 | Garcia |
| 11,264,966 B2 | 3/2022 | Yantchev |
| 11,264,969 B1 | 3/2022 | Fenzi |
| 11,271,539 B2 | 3/2022 | Yantchev |
| 11,271,540 B1 | 3/2022 | Yantchev |
| 11,283,424 B2 | 3/2022 | Turner |
| 11,309,865 B1 | 4/2022 | Guyette |
| 11,323,089 B2 | 5/2022 | Turner |
| 11,323,090 B2 | 5/2022 | Garcia |
| 11,323,091 B2 | 5/2022 | Kay |
| 11,323,095 B2 | 5/2022 | Garcia |
| 11,323,096 B2 | 5/2022 | Yantchev |
| 11,349,450 B2 | 5/2022 | Yantchev |
| 11,349,452 B2 | 5/2022 | Yantchev |
| 11,356,077 B2 | 6/2022 | Garcia |
| 11,368,139 B2 | 6/2022 | Garcia |
| 11,374,549 B2 | 6/2022 | Yantchev |
| 11,381,221 B2 | 7/2022 | McHugh |
| 2002/0079986 A1 | 6/2002 | Ruby et al. |
| 2002/0130736 A1 | 9/2002 | Mukai |
| 2002/0153970 A1 | 10/2002 | Noto |
| 2002/0158714 A1 | 10/2002 | Kaitila et al. |
| 2002/0189062 A1 | 12/2002 | Lin et al. |
| 2003/0042998 A1 | 3/2003 | Edmonson |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0130410 A1 | 7/2004 | Nishimura et al. |
| 2004/0140866 A1 | 7/2004 | Taniguchi |
| 2004/0233020 A1 | 11/2004 | Nakamura |
| 2004/0261250 A1 | 12/2004 | Kadota et al. |
| 2005/0077982 A1 | 4/2005 | Funasaka |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0152107 A1 | 7/2006 | Tanaka |
| 2006/0179642 A1 | 8/2006 | Kawamura |
| 2007/0030096 A1 | 2/2007 | Nichihara et al. |
| 2007/0170565 A1 | 7/2007 | Hong et al. |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0019866 A1 | 1/2010 | Hara et al. |
| 2010/0064492 A1 | 3/2010 | Tanaka |
| 2010/0117483 A1 | 5/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0254406 A1 | 10/2011 | Yamane |
| 2011/0278993 A1 | 11/2011 | Iwamoto |
| 2012/0073390 A1 | 3/2012 | Zaghloul et al. |
| 2012/0198672 A1 | 8/2012 | Ueda et al. |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0170405 A1* | 7/2013 | Yan .................. H03H 9/542 |
| | | 333/195 |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi |
| 2014/0130319 A1 | 5/2014 | Iwamoto |

(56) References Cited

U.S. PATENT DOCUMENTS

| | | |
|---|---|---|
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2014/0340173 A1 | 11/2014 | Burgener et al. |
| 2015/0014795 A1 | 1/2015 | Franosch |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182009 A1 | 6/2016 | Bhattacharjee |
| 2017/0063332 A1 | 3/2017 | Gilbert et al. |
| 2017/0155373 A1 | 6/2017 | Ruby |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0272051 A1* | 9/2017 | Kurihara ............... H03H 9/6483 |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0262179 A1 | 9/2018 | Goto |
| 2018/0278227 A1 | 9/2018 | Hurwitz |
| 2018/0309426 A1 | 10/2018 | Guenard |
| 2019/0044498 A1 | 2/2019 | Kawasaki |
| 2019/0068164 A1 | 2/2019 | Houlden et al. |
| 2019/0123721 A1 | 4/2019 | Takamine |
| 2019/0131953 A1 | 5/2019 | Gong |
| 2019/0181832 A1 | 6/2019 | Schmalzl et al. |
| 2019/0190487 A1 | 6/2019 | Yasuda |
| 2019/0245509 A1 | 8/2019 | Hurwitz |
| 2019/0253038 A1 | 8/2019 | Houlden |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1* | 12/2019 | Plesski ............... H03H 9/02031 |
| 2020/0007110 A1 | 1/2020 | Konaka et al. |
| 2020/0021272 A1 | 1/2020 | Segovia Fernandez et al. |
| 2020/0028481 A1 | 1/2020 | Sun et al. |
| 2020/0036357 A1 | 1/2020 | Mimura |
| 2020/0083861 A1 | 3/2020 | Matsuo |
| 2020/0083863 A1 | 3/2020 | Makkonen et al. |
| 2020/0177160 A1 | 6/2020 | Jachowski |
| 2020/0235719 A1 | 7/2020 | Yantchev et al. |
| 2020/0259480 A1 | 8/2020 | Pensala |
| 2020/0274520 A1 | 8/2020 | Shin |
| 2020/0313645 A1 | 10/2020 | Caron |
| 2020/0343874 A1 | 10/2020 | Yantchev |
| 2020/0350891 A1 | 11/2020 | Turner |
| 2021/0013859 A1 | 1/2021 | Turner et al. |
| 2021/0119595 A1 | 4/2021 | Turner et al. |
| 2021/0126619 A1 | 4/2021 | Wang et al. |
| 2021/0152154 A1 | 5/2021 | Tang |
| 2021/0159877 A1* | 5/2021 | Fukuhara ............ H03H 9/02574 |
| 2021/0265978 A1 | 8/2021 | Plesski et al. |
| 2021/0273631 A1 | 9/2021 | Jachowski et al. |
| 2021/0328574 A1 | 10/2021 | Garcia |
| 2021/0351762 A1 | 11/2021 | Dyer et al. |
| 2021/0399750 A1 | 12/2021 | Varela Campelo |
| 2022/0140224 A1* | 5/2022 | Hamasaki ............ H03H 9/0547 |
| | | 310/366 |
| 2022/0329227 A1* | 10/2022 | Goto .................... H03H 9/0547 |
| 2022/0416757 A1* | 12/2022 | Hatakeyama ........ H03H 9/0547 |

FOREIGN PATENT DOCUMENTS

| | | |
|---|---|---|
| WO | 2016017104 | 2/2016 |
| WO | 2018003273 | 1/2018 |
| WO | 2021135009 A1 | 7/2021 |

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).

Buchanan "Ceramic Materials for Electronics" 3rd Edition, first published in 2004 by Marcel Dekker, Inc. pp. 496 (Year 2004). Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Gnewuch, et al. "Broadband monolithic acousto-optic tunable filter", Mar. 1, 2000 / vol. 25, No. 5 / Optics Letters (Year: 2000).

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Kadota et al., "Ultra-Wideband Ladder Filter Using SHO Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 TIBTECH Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

(56) References Cited

OTHER PUBLICATIONS

Naumenko et al., "Optimal orientations of Lithium Niobate for resonator SAW filters", 2003 IEEE Ultrasonics Symposium—pp. 2110-2113. (Year: 2003).
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
Reinhardt, "Acoustic filters based on thin single crystal LiNbQ,3 films: status and prospects", 2014 IEEE International Ultrasonics Symposium Proceedings, pp. 773-781 (Year: 2014).
Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.
Safari et al. "Piezoelectric for Transducer Applications" published by Elsevier Science Ltd., pp. 4 (Year: 2000). 2020.
Santosh, G. , Surface acoustic wave devices on silicon using patterned and thin film ZnO, Ph.D. thesis, Feb. 2016, Indian Institute of technology Guwahati, Assam, India Feb. 2016.
Sinha et al., "Slanted finger Inter-digital Transducers for the design of improved performance small shape factor mid-bandwidth SAW filters", IEEE MTT-S International Microwave and RF Conference, 2013. (Year: 2013).
Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 2015.
T. Takai, H. Iwamoto, et al., "I.H.P.Saw Technology and its Application to Microacoustic Components (Invited)." 2017 EEE International Ultrasonics Symposium, Sep. 6-9, 2017. pp. 1-8.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
USPTO/ISA, International Search Report and Written Opinion for PCT Application No. PCT/US2020/45654 dated Oct. 29, 2020.
USPTO/ISA, International Search Report and Written Opinion for PCT Application No. PCT/US2021/024824 dated Jul. 27, 2021, 9 total pages.
USPTO/ISA, International Search Report and Written Opinion for PCT Application No. PCT/US2021/048505 dated Dec. 1, 2021, 11 total pages.
Wu et al., "Frequency band-gap measurement of two-dimensional air/silicon phononic crystals using layered slanted finger interdigital transducers", J. Appl. Phys. 97, 094916, 2005 (Year: 2005).
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
Zou, Jie "High-Performance Aluminum Nitride Lamb Wave Resonators for RF Front-End Technology" University of California, Berkeley, Summer 2015, pp. 63 (Year 2015) Jan. 2015.

\* cited by examiner

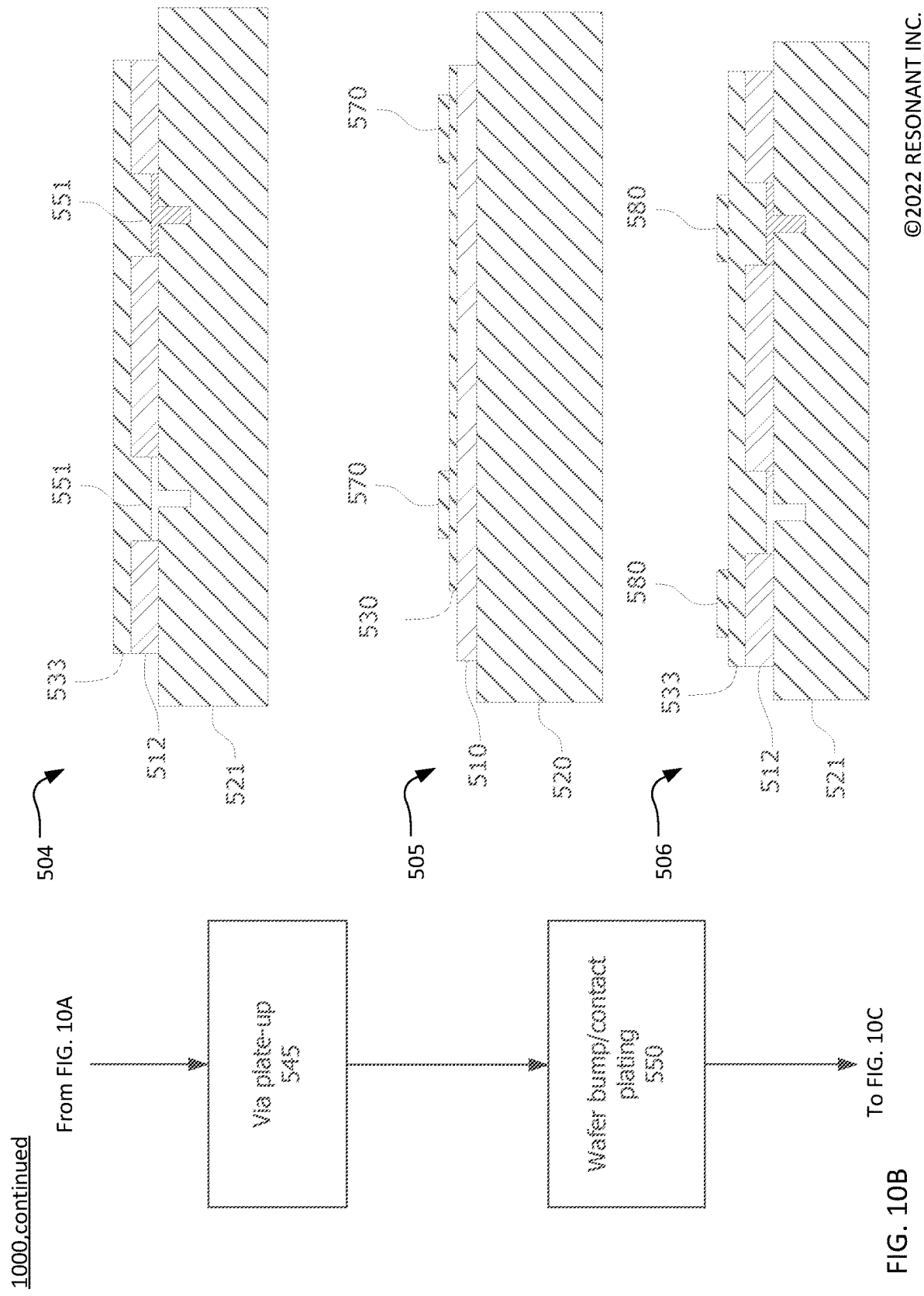

STACKED DIE TRANSVERSELY-EXCITED FILM BULK ACOUSTIC RESONATOR (XBAR) FILTERS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims priority to co-pending U.S. provisional patent application No. 63/275,870, titled STACKED DIE XBAR FILTERS, filed Nov. 4, 2021.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 1300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIGS. 10A, 10B, 10C and 10D are a flow chart of a process for fabricating a stacked die XBAR resonator filter.

Figure 1:
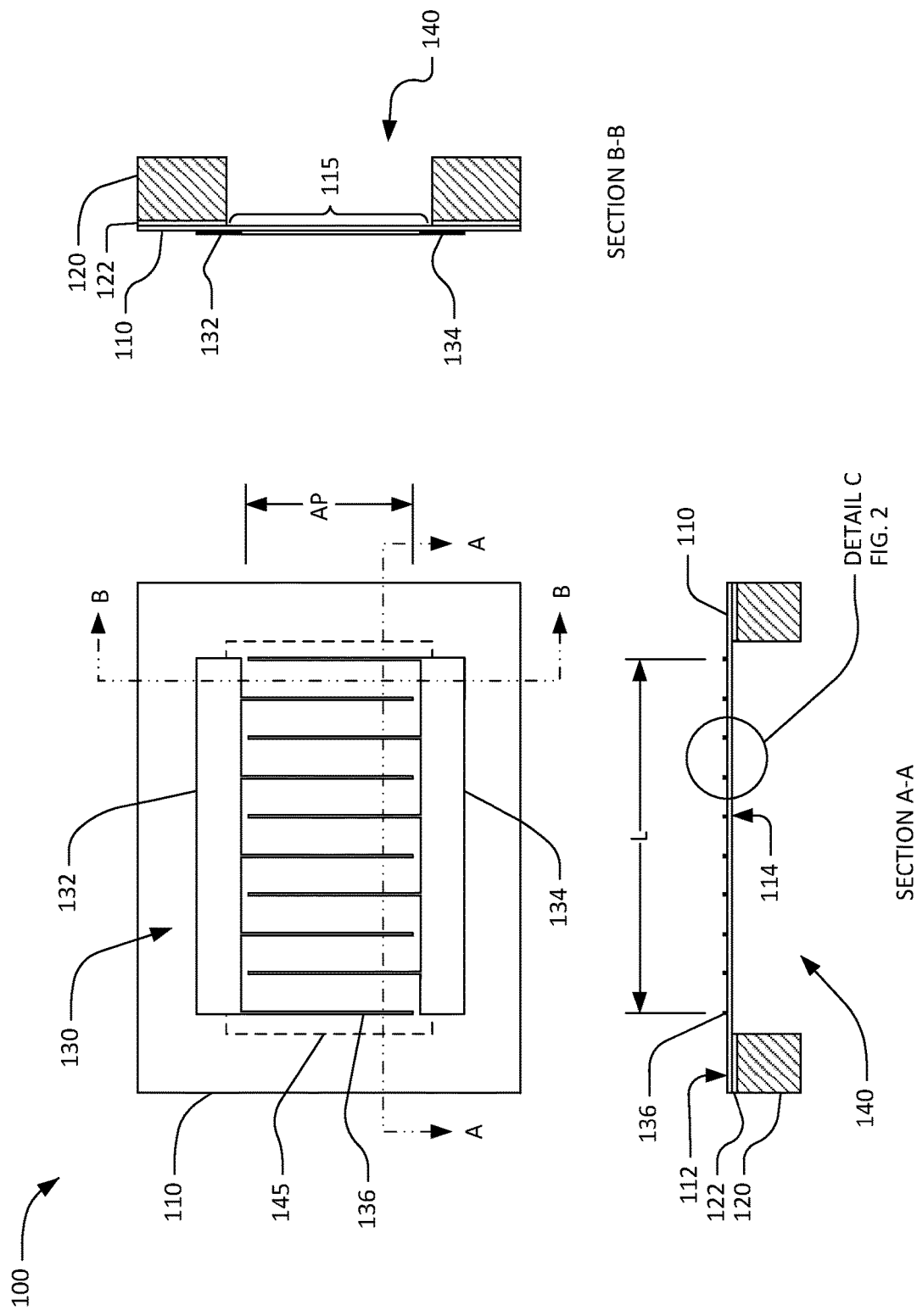
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator or the same two least significant digits.

DETAILED DESCRIPTION

Description of Apparatus

The Transversely-Excited Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include the front-side and/or back-side dielectric layers. An XBAR resonator may be such a diaphragm or membrane with an interdigital transducer (IDT) formed on the diaphragm or membrane. Contact pads can be formed at selected locations over the surface of the substrate to provide electrical connections between the IDT and contact bumps to be attached to or formed on the contact pads.

The resonance frequency of an XBAR is primarily set by the thickness of the diaphragm. Some broadband filters may require two different diaphragm thicknesses, which may be implemented on two different XBAR die or chips.

The following describes improved XBAR resonators, filters and fabrication techniques for stacked die XBAR resonator filters, such as accomplished using a three-dimensional packaging system that allows multiple XBAR die or chips to be stacked in a common chip or package. This stacked die XBAR may be an XBAR filter package consisting of one or more layers of stacked resonator substrates creating a 3-dimensional (3D) radio frequency (RF) structure or filter. This can be done by forming a stacked die XBAR filter device having a first die containing one or more XBARs on a first surface, a second die containing one or more XBARs on a second surface, and one or more conductive vias through either the first die or the second die, where the first die is connected to the second die with the first surface facing the second surface.

Allowing resonators to be stacked vertically shrinks die footprint without reducing resonator sizes and subsequent power handling. Combining resonators from separate die allows them to be sourced or combined from different wafers with different resonator stackups (e.g., different electrode thickness and piezoelectric plate thickness) and different resonant frequencies, such as for ladder filter series and shunt resonators. The different stackups and frequencies on the vertically stacked different die lessens the range, time and expense of tuning of the resonators required to form the filter.

Another approach is to use a single layer planar package where all resonators are in plane and fabricated with or on a common piezoelectric plate thickness. Thick $SiO_2$ is deposited on some resonators (e.g., shunt resonators) to shift down their resonant frequency. These planar designs cause die size to directly scale and increase with increased resonator sizes, although a lower die size scaling is desired. Also, a thick $SiO_2$ layer to shift down the resonant frequency has acoustic effects that adds to a native XBAR response and must be compensated for. This compensation adds frequency variation and can compromise XBAR response, which is not desirable. Also, more resonators on the piezoelectric plate require a bigger die area which is not wanted; and thick oxide can add undesired spurs to the resonator frequency response.

Using thick $SiO2$ to shift the resonant frequency down also reduces the acoustic coupling of the resonator which is not desired. Less coupling reduces the maximum bandwidth of the assembled filter. To compensate for this and maintain bandwidth, a stronger coupling piezo material must be chosen which may have more spurious responses in-band. Compensating for the spurious may require changing IDT metal thicknesses and/or mark and pitch to sub-optimal dimensions for other filter parameters. The native frequency response varies with the piezo thickness variation across the wafer. The $SiO2$ deposition can also vary in thickness across the wafer adding more frequency variation and may require wafer level tuning/trimming to remove. Using the stacked die XBAR provides advantages of not only different plate thicknesses for the series and shunt die, but also allows different piezo material to be used on each of those die.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate is attached directly to the substrate or may be attached to the substrate via a bonding oxide layer 122, such as a bonding oxide (BOX) layer of SiO2, or another oxide such as $Al_2O_3$.

As shown in FIG. 1, the diaphragm 115 is contiguous with the rest of the piezoelectric plate 110 around all of a perimeter 145 of the cavity 1. In this context, "contiguous" means "continuously connected without any intervening item". However, it is possible for a bonding oxide layer (BOX) to bond the plate 110 to the substrate 120. The BOX layer may exist between the plate and substrate around perimeter 145 and may extend further away from the cavity than just within the perimeter itself. In the absence of a process to remove it (i.e., this invention) the BOX is everywhere between the piezoelectric plate and the substrate. The BOX is typically removed from the back of the diaphragm 115 as part of forming the cavity.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item". In some cases, a BOX layer may bond the plate 110 to the substrate 120 around the perimeter.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
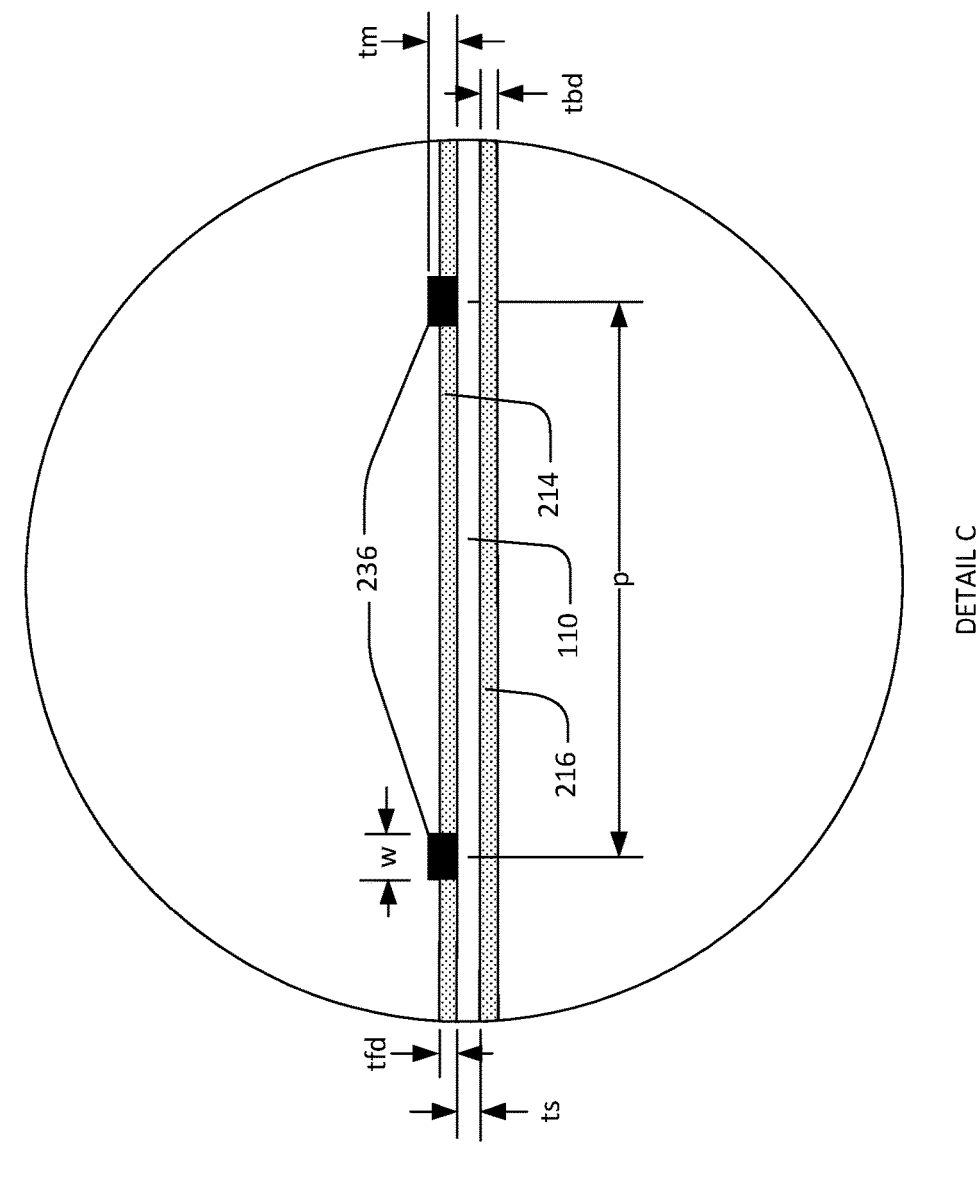
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g., bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 236. Although not shown in FIG. 2, the front side dielectric layer 214 may also be deposited over the IDT fingers 236. A back-side dielectric layer 216 may optionally be formed on the back side of the piezoelectric plate 110. The back-side dielectric layer may be or include the BOX layer. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness is of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal conductors from water and chemical corrosion, particularly for power durability purposes. It may range from 10 to 100 nm. The passivation material may consist of multiple oxide and/or nitride coatings such as SiO2 and Si3N4 material.

The IDT fingers 236 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
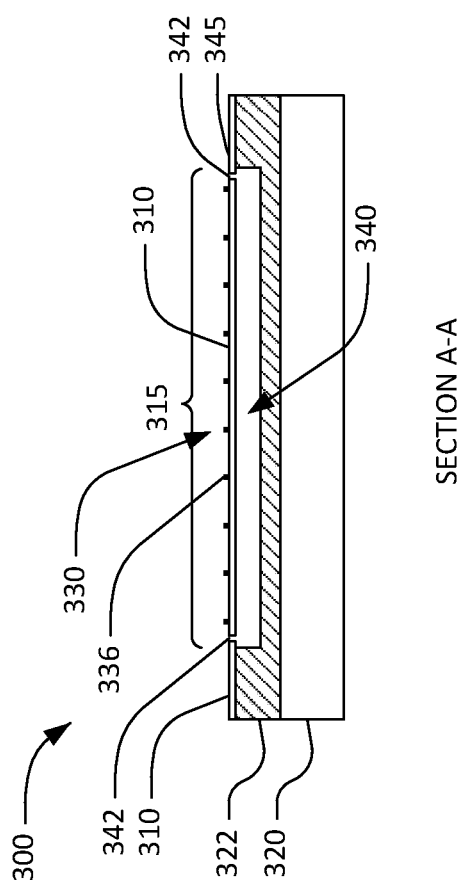
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to an intermediate layer 322 of a substrate 320. A portion of the piezoelectric plate 310 forms a diaphragm 315 spanning a cavity 340 in the substrate. The cavity 340, does not fully penetrate the intermediate layer 322, and is formed in the layer 322 under the portion of the piezoelectric plate 310 containing the IDT 330 of a conductor pattern (e.g., first metal or M1 layer) of an XBAR. Fingers, such as finger 336, of an IDT are disposed on the diaphragm 315. Interconnection of the IDT (e.g., busbars) 330 to signal and ground paths may be through a second conductor pattern (e.g., M2 metal layer, not shown in FIGS. 1-3A) to electrical contacts on a package.

Plate 310, diaphragm 315 and fingers 336 may be plate 110, diaphragm 115 and fingers 136 (or 236). The cavity 340 may be formed, for example, by etching the layer 322 before attaching the piezoelectric plate 310. Alternatively, the cavity 340 may be formed by etching the layer 322 with a selective etchant that reaches the layer 322 through one or more holes or openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

Intermediate layer 322 may be one or more intermediate material layers attached between plate 310 and substrate 320. An intermediary layer may be or include a bonding layer, a BOX layer, an etch stop layer, a sealing layer, an adhesive layer or layer of other material that is attached or bonded to plate 310 and substrate 320. A layer of layers 322 may be a dielectric, an oxide, a silicon oxide, silicon nitride, an aluminum oxide, silicon dioxide or silicon nitride. Layers 322 may be one or more of any of these layers or a combination of these layers.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e., down from plate 310 as shown in the figure) extent or depth of the cavity 340 into substrate 320. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

In some cases, the substrate comprises a base substrate 320 and an intermediate layer (not shown) to reinforce an intermediate bonding oxide (BOX) layer. Here, the first intermediate layer may be considered a part of the substrate base 320.

In some cases, layer 322 does not exist and the plate is bonded directly to the substrate 320; and the cavity is formed in and etched into the substrate 320.

In some cases, although not shown in the figure, layer 322 is a thinner layer than the depth of the cavity such that the plate is bonded directly to layer 322; and the cavity is formed in and etched into the layer 322 and into the substrate 320. Here, the cavity extends completely through layer 322 and has a cavity bottom in the substrate 320.

Figure 3B:
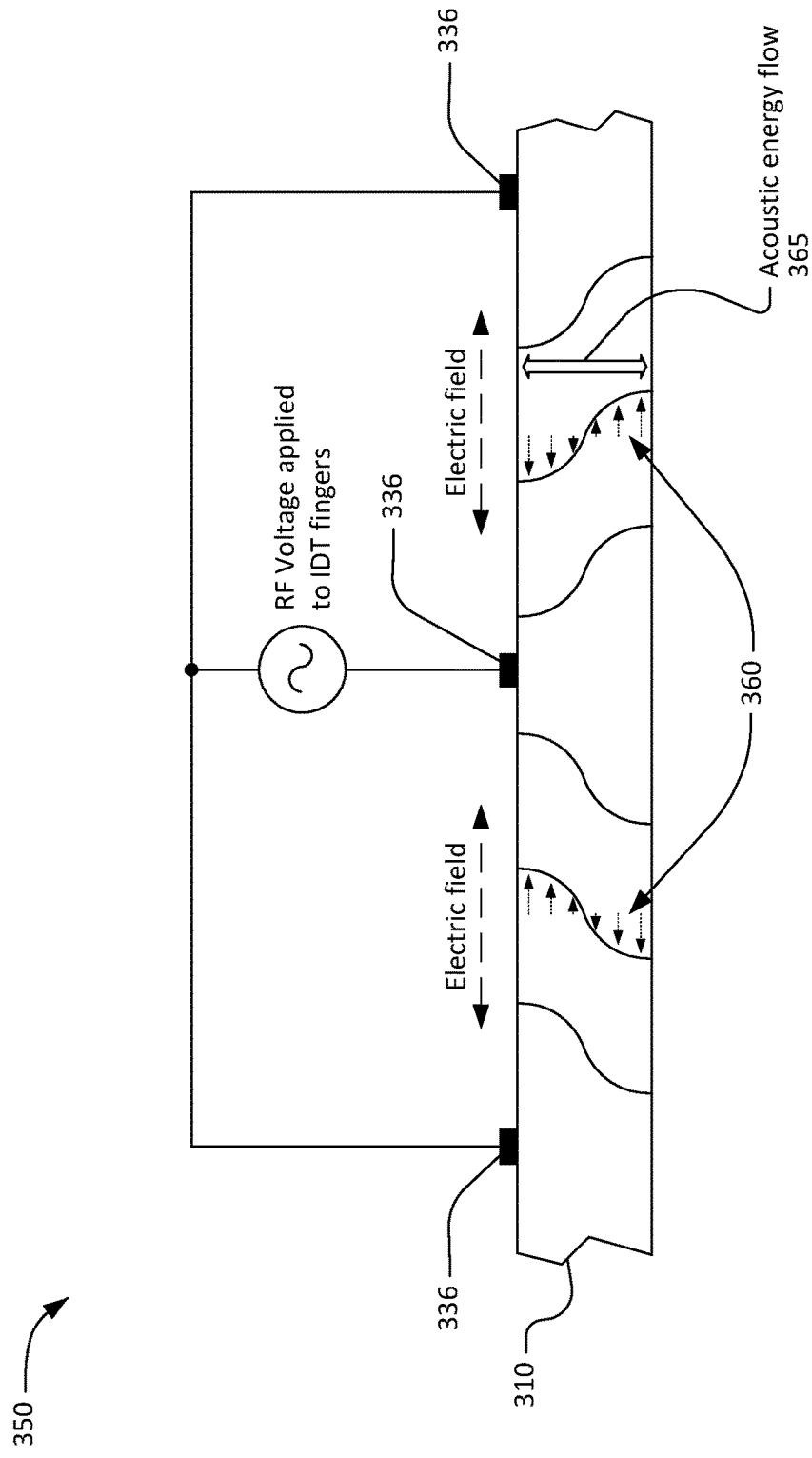
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4:
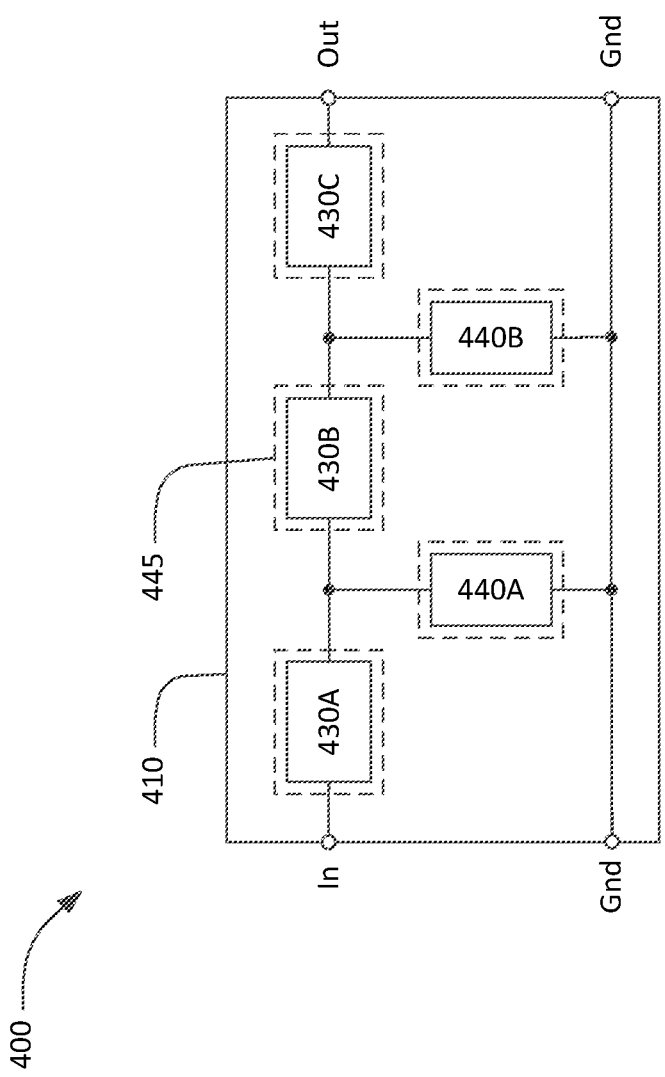
FIG. 4 is a schematic circuit diagram and layout for a high frequency band-pass filter using XBARs.

FIG. 4 is a schematic circuit diagram and layout for a high frequency band-pass filter 400 using XBARs. The filter 400 has a conventional ladder filter architecture including three series resonators 430A, 430B, 430C and two shunt resonators 440A, 440B. The three series resonators 430A, 430B, and 430C are connected in series between a first port and a second port. In FIG. 4, the first and second ports are labeled "In" and "Out", respectively. However, the filter 400 is bidirectional and either port and serve as the input or output of the filter. The two shunt resonators 440A, 440B are connected from nodes between the series resonators to ground. All the shunt resonators and series resonators are XBARs on a single die. All or most of the resonators of FIG. 4 are XBAR resonators as noted herein.

The three series resonators 430A, B, C and the two shunt resonators 440A, B of the filter 400 may be formed on a single plate 410 of piezoelectric material bonded to a silicon substrate (not visible). Alternatively, as will be described in further detail, the series resonators and the shunt resonators may be formed on separate plate of piezoelectric material. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 4, the cavities are illustrated schematically as the dashed rectangles (such as the rectangle 445). In this example, each IDT is disposed over a respective cavity. In other filters, the IDTs of two or more resonators may be disposed over a single cavity.

Figure 5:
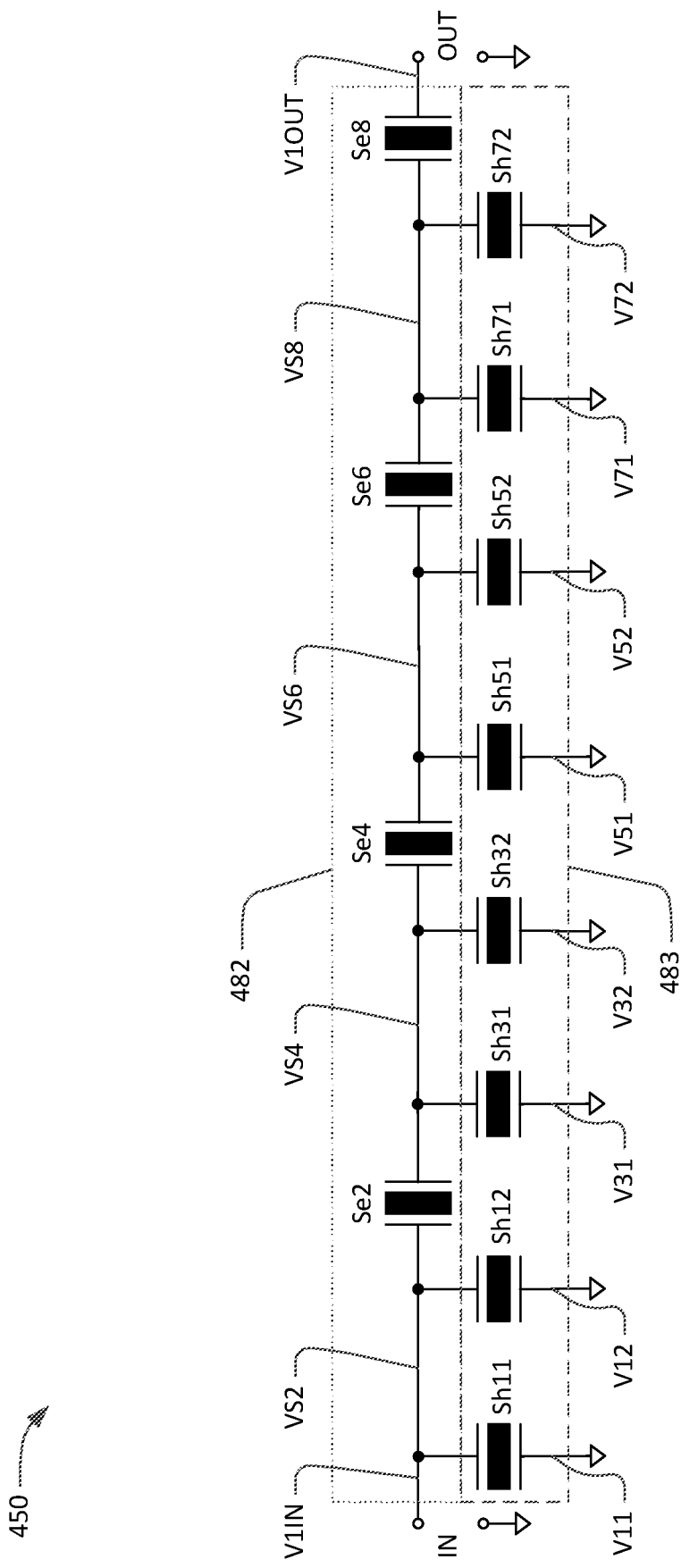
FIG. 5 is a schematic circuit diagram and layout for a stacked die XBAR high frequency band-pass filter.

FIG. 5 is a schematic circuit diagram and layout for a high frequency band-pass filter 450 using XBARs. The filter 450 has a ladder or a half ladder filter architecture including four series resonators Se2, Se4, Se6 and Se8 and four shunt resonators connect as parallel pairs of resonators Sh11 and Sh22; Sh31 and Sh32; Sh51 and Sh52; and Sh71 and Sh72. The four series resonators Se2, Se4, Se6 and Se8 are connected in series between a first port IN and a second port OUT. In this patent, the term "series" used as an adjective (e.g. series resonator, series inductor, series capacitor, series resonant circuit) means a component connected in series with other component along signal path extending from the input to the output of a network. The filter circuit 450 may be, for example, an RF transmit filter or/or an RF receive filter for incorporation into a communications device, such as a cellular telephone. The filter circuit 450 is a two-port network where one terminal of each port is typically connected to a signal ground. In FIG. 5, the first and second ports are labeled "IN" for input and "OUT" for output, respectively. However, the filter 450 is bidirectional and either port and serve as the input or output of the filter. Each shunt resonator is connected between ground and a junction of adjacent series resonators. Shunt resonator pair Sh11 and Sh12 is connected from the first port to ground, although in other cases it may be connected between the second port and ground. The other three shunt resonator pairs Sh31 and Sh32; Sh51 and Sh52; and Sh71 and Sh72 are connected from nodes between the series resonators to ground. In this patent, the term "shunt" used as an adjective (e.g. shunt resonator, shunt inductor, shunt resonant circuit) means a component connected from a node along the series signal path to ground. All or most of the resonators of FIG. 5 are XBAR resonators as noted herein.

Filter 450 is shown with conductive vias V1IN, V11, V12, V31, V32, V51, V52, V71, V72, VS2, VS4, VS6, VS8 and V1OUT that may extend through and between surfaces of die 482 and/or die 483 as shown and explained herein.

The schematic diagram of FIG. 5 is simplified in that passive components, such as the inductances inherent in the conductors interconnecting the resonators, are not shown. The use of 12 acoustic wave resonators, four series resonators, and four pair of shunt resonators is exemplary. A band-pass filter circuit may include more than, or fewer than, 12 resonators; more than, or fewer than, four series resonators; and/or more or fewer than four pair of shunt resonators. For example, there may be eight series resonators and eight shunt resonators that are not in pairs.

All the series resonators are XBARs on a single die 482. A die may be a single chip, IC chip, piezoelectric plate, or substrate, such as a piece which has been diced from a processed semiconductor wafer. All the shunt resonators are XBARs on a single die 483 that is different than a die having any of the shown series resonators. In some cases, the shunt resonators are on two die, such as where the Shx1 resonators are on one die and the Shx2 resonators are on another die. in other cases, the series resonators may be on three or four die and the shunt resonators may be on three, four or five die.

Each die may have a single plate of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In this example, each IDT is disposed over a respective cavity. In other filters, the IDTs of two or more resonators may be disposed over a single cavity.

FIGS. 6A, 6B, 6C and 6D are top schematic views of a stacked die XBAR resonator filter 600 having series resonators on one die 640 and shunt resonators on another die 630. Filter 600 may be a two layer die split ladder package with two stacked die or chips that may exist in a single package.

Figures 6A, 6B:
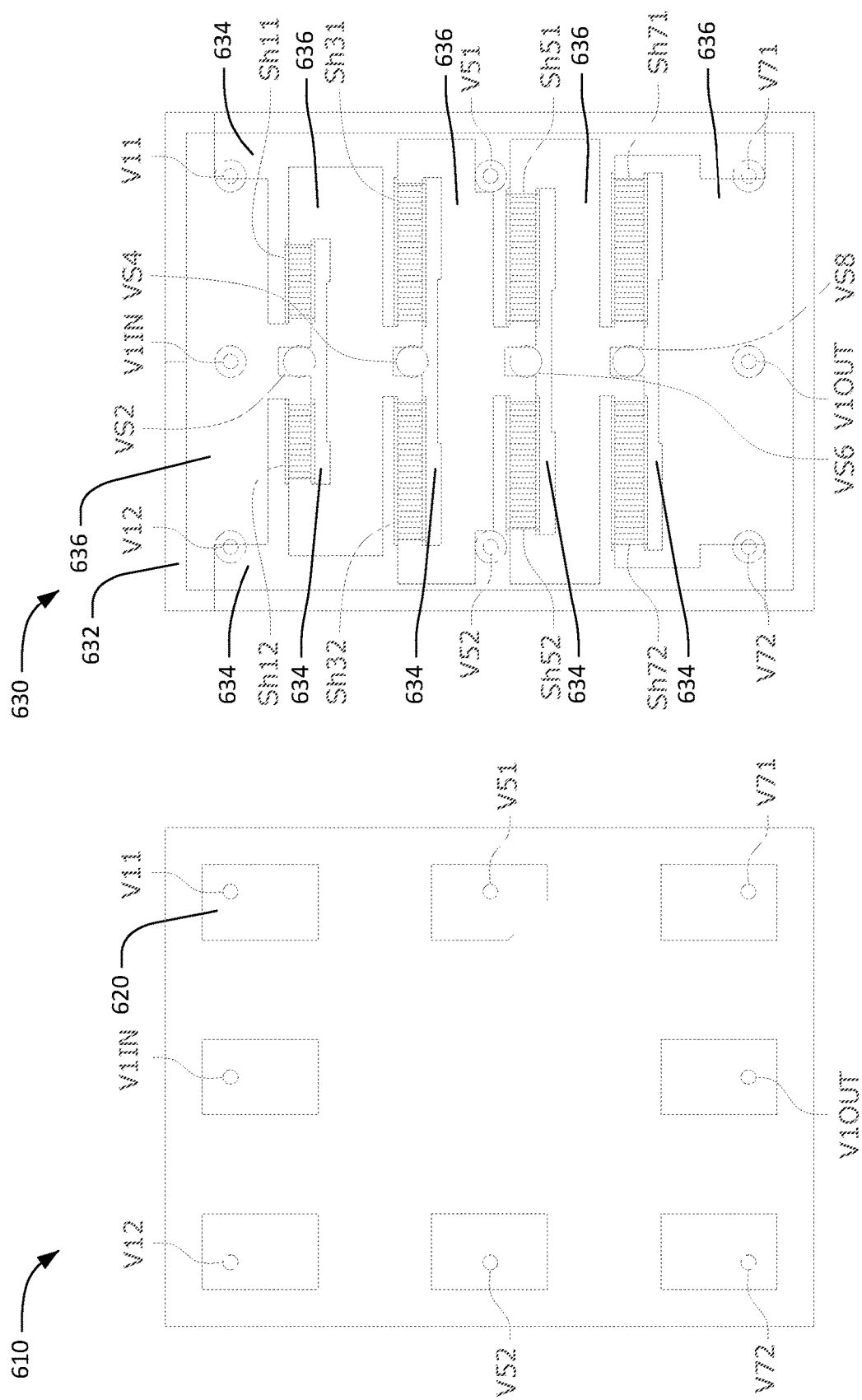
FIGS. 6A, 6B, 6C, 6D and 6E are a stacked die XBAR resonator filter having series resonators on one die and shunt resonators on another die.

FIG. 6A shows a package bottom or backside of filter 600 having lid surface 610 with lid backside-package contacts or contact pads 620. The pads 620 are configured to be electrically connected to external circuitry such as through solder bumps, or other connections (not shown) to electrically conducting signal and ground paths, wires, traces and/or the like. Each pad 620 has or is electrically connected to a conductive via that extends through at least one die of filter 600. For filter 600, each pad 620 has or is electrically connected to one of conductive vias V1IN, V11, V12, V31, V32, V51, V52, V71, V72 and V1OUT.

Conductive vias V1IN and V1OUT may be through wafer vias (TWVs) electrically connecting the one or more XBARs on a surface of one or more die of filter 600 to external circuitry, such as an input signal line and an output signal line. Conductive vias V11, V12, V31, V32, V51, V52, V71 and V72 may be TWVs electrically connecting the one or more XBARs on the second surface of a second die of filter 600 to ground, such as through or to external ground circuitry.

Surface 610 may be an insulator, a dielectric such as SiO2, glass, a package material or a capping material. Surface 610 may be a silicon carrier wafer with patterned structures including contact pads 620. It may be a printed circuit board (PCB), a high-temperature co-fired ceramics (HTCC) and/or another package for the filter 600. It may have signal routing (e.g., vias, traces, contact pads and/or wires). In some cases, the package is a PCB laminate with copper (Cu) signal routing. It may be or include a protective encapsulating layer for the filter 600.

Pads 620, conductor and the conductive vias herein may be gold, copper, silver, a metal, a conductive alloy or another conductor material. Although not shown, filter 600 may have gold or another conductor stud bumps attached to pads 620. Filter 600 may then be flip-chipped bonded to a PCB or ceramic substrate, then a standard overmolding process (not shown) may be used to encapsulate the device 600.

FIG. 6B shows a bottom die 630 of filter 600, the die 630 having shunt resonators and conductive vias extending through surface 610 and die 630. Die 630 may be the package lid of filter 600. Die 630 may be a shunt resonator die/lid with a piezoelectric plate thickness=T1 and resonance frequency=F1. Depending upon piezo materials, the shunt resonator thicknesses T1 can be from 500 nm for frequencies F1 at 3.3 GHz to 300 nm for frequencies F1 at 6 GHz. Thus, using the stacked die XBAR provides advantages of not only different plate thicknesses for the series and shunt die, but also allows different piezo material to be used on each of those die/layers. In some cases, the frequency range of die 630 depends on the application. It could be anywhere in the RF range. The shunt resonator piezoelectric plate(s) may be greater in thickness than the series resonator plate so that the shunt resonator resonant frequency F2 is lower than the series resonator resonant frequency F1.

Die 630 contains or includes shunt XBARs Sh11, Sh12, Sh31, Sh32, Sh51, Sh52, Sh71 and Sh72, on (e.g., formed in or on) a surface 632. Die 630 contains conductive vias V1IN, V11, V12, V31, V32, V51, V52, V71, V72 and V1OUT through surface 610 and to contacts 620. These vias may be on or extend through: a) surface 632 and/or b) die 630 to die 640 (see FIG. 6C).

Die 630 contains conductive vias VS2, VS4, VS6 and VS8 on surface 632 and connected to die 640. Conductive vias VS2, VS4, VS6 and VS8 may electrically connect XBARs of die 630 to XBARs or conductive vias of die 640.

Die 630 has conductive layer or traces 634 and insulator or dielectric 636 between trances 634 as shown. Traces 634 and dielectric 636 electrically connect the vias and shunt XBARs of die 630 as shown in FIGS. 5 and 6B. Traces 634, dielectric 636 and the vias VS2, VS4, VS6 and VS8 of die 630 connect the shunt XBARs of die 630 to series XBARS of die 640 as shown in FIGS. 5 and 6E.

Figure 6C:
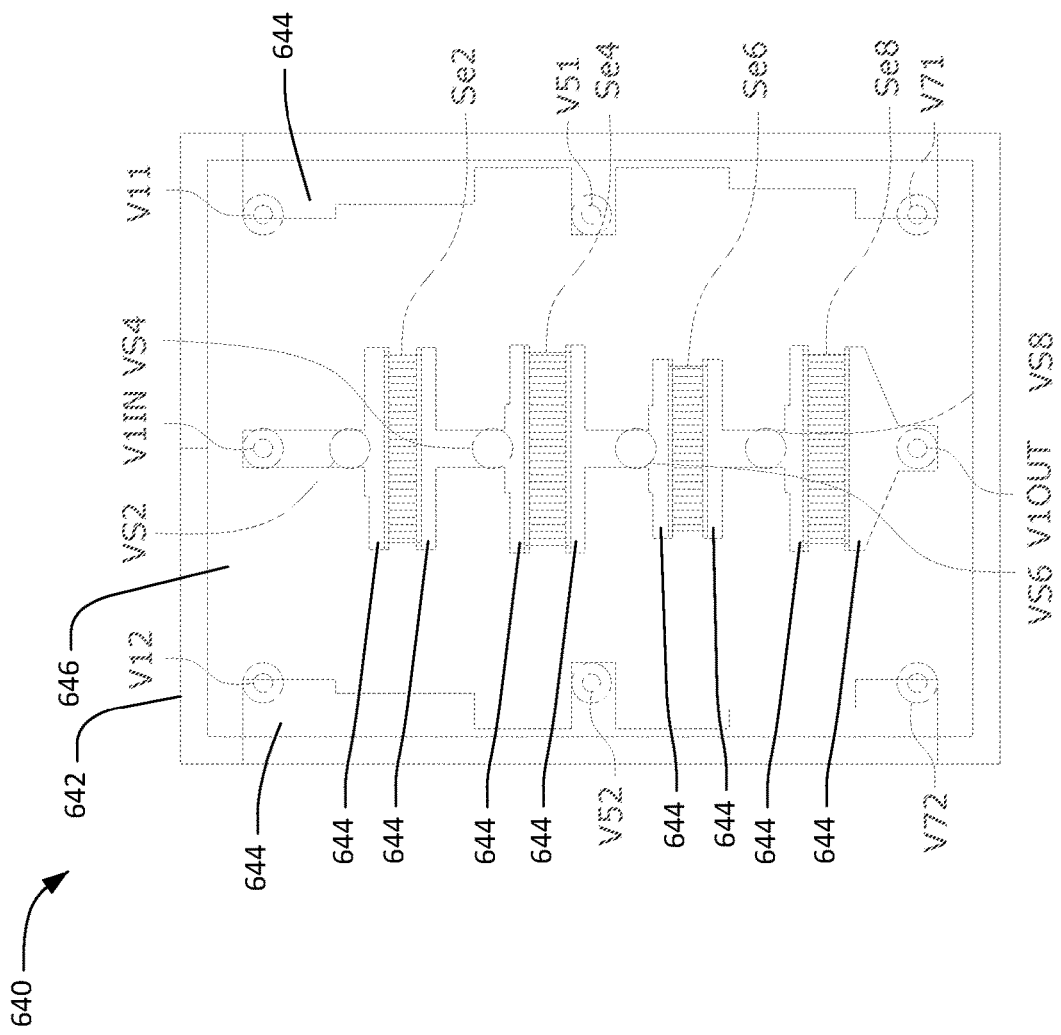
Figure 6D:
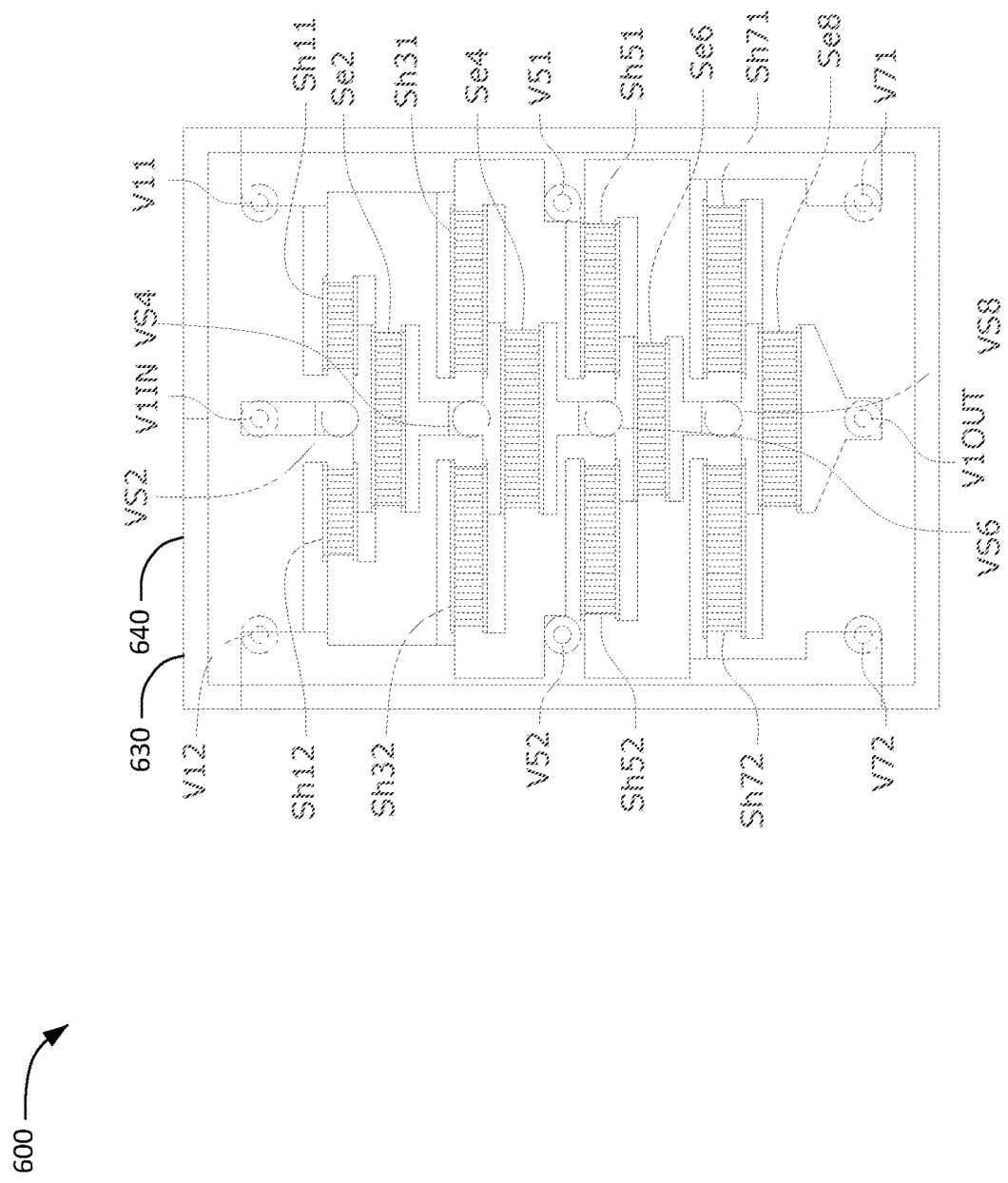
Figure 6E:
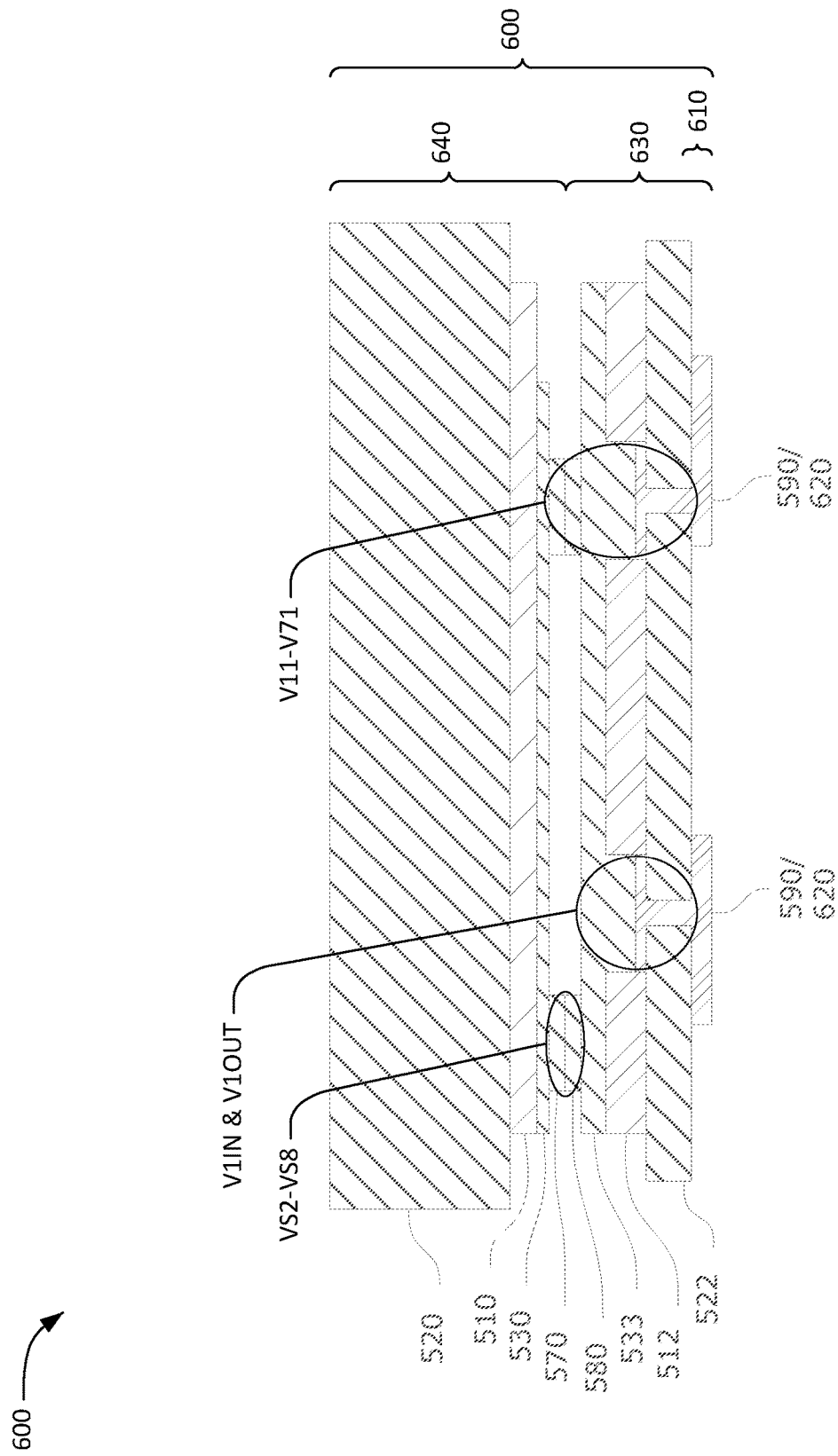

Traces 634, dielectric 636 and the vias V1IN and V1OUT of die 360 connect the shunt XBARs of die 630 to: a) die 640; and b) input and output signal lines of die 640 and of surface 610 as shown in FIGS. 5-6E. Traces 634, dielectric 636 and the vias V11, V12, V31, V32, V51, V52, V71 and V72 of die 360 connect the shunt XBARs of die 630 to ground and to die 640 as shown in FIGS. 5-6E.

FIG. 6C shows a top die 640 of filter 600, the die 640 having series resonators and conductive vias extending from or through die 640. Die 640 may be the package base or substrate of filter 600. Die 640 may be a series resonator die/back with a piezoelectric plate thickness=T2 and resonance frequency=F2. Depending upon piezo materials, the series resonator thicknesses T2 can be from 480 nm for frequencies F2 at 3.1 GHz to 280 nm for frequencies F2 at 6.5 GHz.

Die 640 contains or includes series XBARs Se2, Se4, Se6 and Se8, on (e.g., formed in or on) a second surface 642. Die 640 contains conductive vias V1IN, V11, V12, V31, V32, V51, V52, V71, V72 and V1OUT to surface 632 and to die 630. Die 640 contains conductive vias VS2, VS4, VS6 and VS8 on surface 642 and connected to die 630. Conductive vias VS2, VS4, VS6 and VS8 may electrically connect XBARs of die 640 to XBARs or conductive vias of die 630.

Die 640 has conductive layer or traces 644 and insulator or dielectric 646 between trances 644 as shown. Traces 644 and dielectric 646 electrically connect the vias and series XBARs of die 640 as shown in FIGS. 5 and 6C.

Traces 644, dielectric 646 and the vias VS2, VS4, VS6 and VS8 of die 640 connect the series XBARs of die 640 to shunt XBARS of die 630 as shown in FIGS. 5-6E. Traces 644, dielectric 646 and the vias V1IN and V1OUT of die 640 connect the series XBARs of die 640 to: a) die 630; and b) input and output signal lines of die 630 and of surface 610 as shown in FIGS. 5-6E. Traces 644, dielectric 646 and the vias V11, V12, V31, V32, V51, V52, V71 and V72 of die 640 connect the series XBARs of die 640 to ground, to die 630, and to surface 610 as shown in FIGS. 5-6E.

FIGS. 6D-6E shows filter 600 with surface 632 and/or vias on that surface bonded to surface 642 and/or vias on that surface.

FIG. 6D shows a top schematic view of bottom die 630 and top die 640 of filter 600. FIG. 6D shows the top view of the layout of shunt XBARs Sh11, Sh12, Sh31, Sh32, Sh51, Sh52, Sh71 and Sh72; series XBARs Se2, Se4, Se6 and Se8; conductive vias V1IN, V11, V12, V31, V32, V51, V52, V71, V72 and V1OUT; and conductive vias VS2, VS4, VS6 and VS8.

Figure 10A:
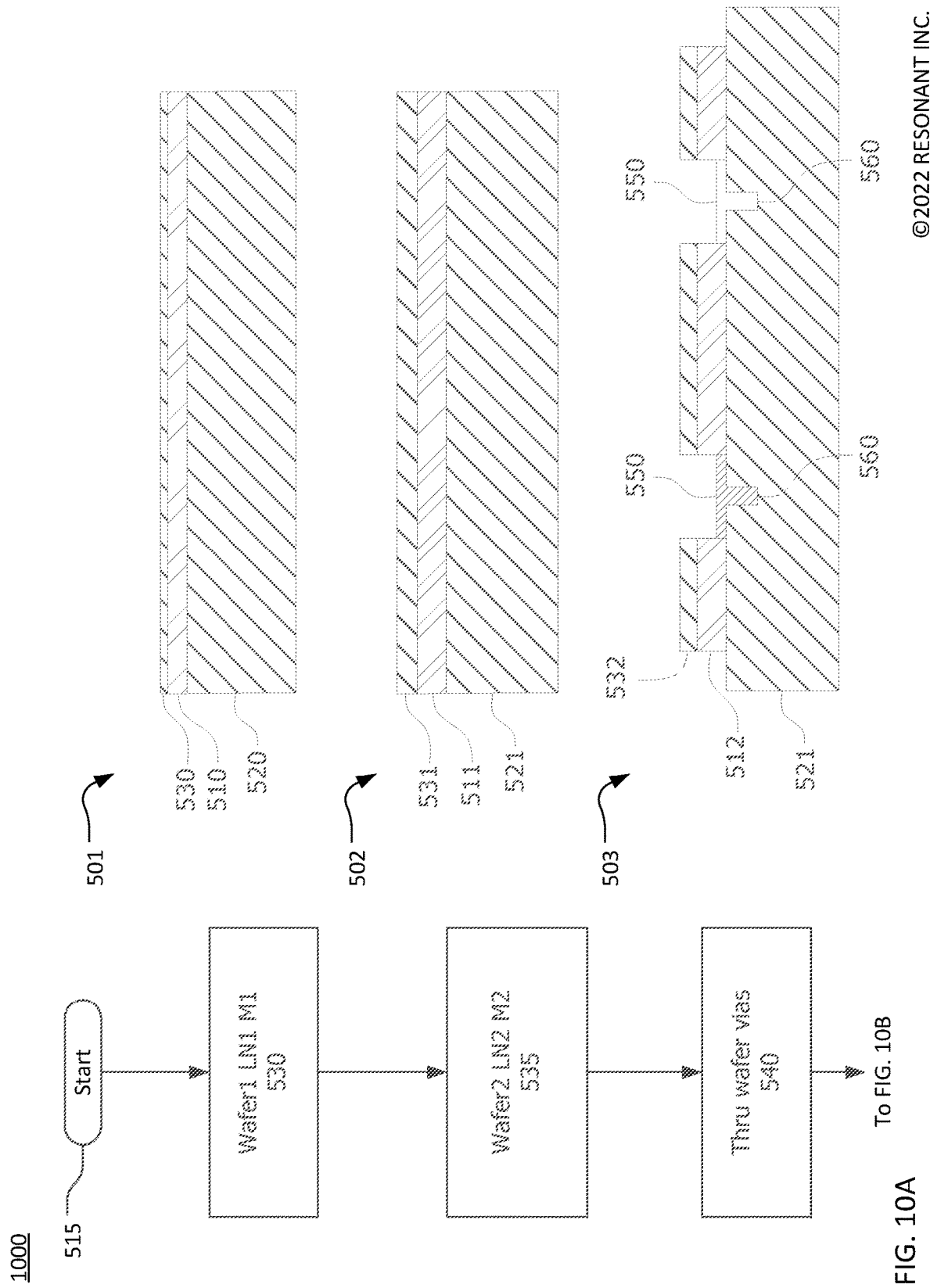
Figure 10C:
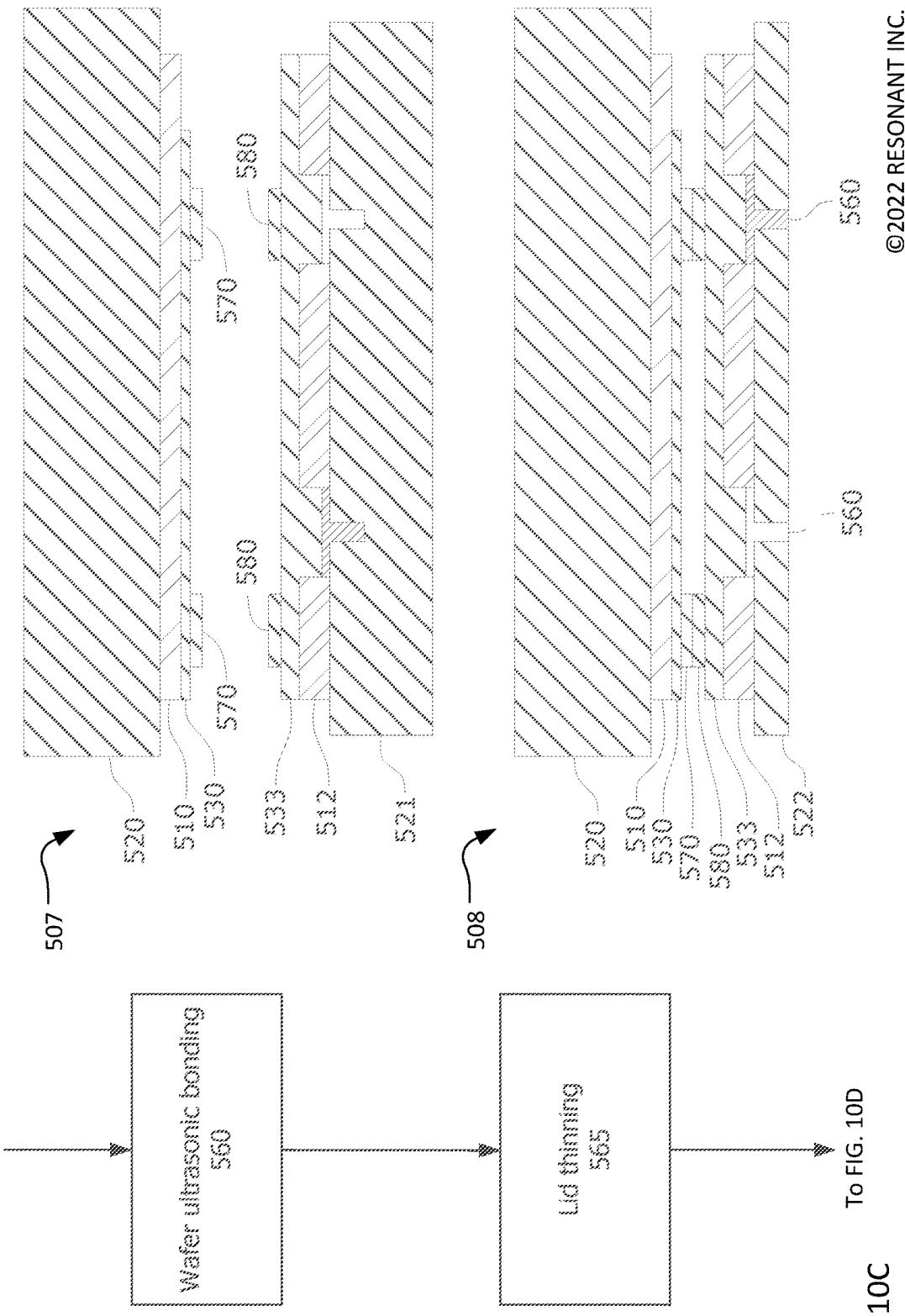
Figure 10D:
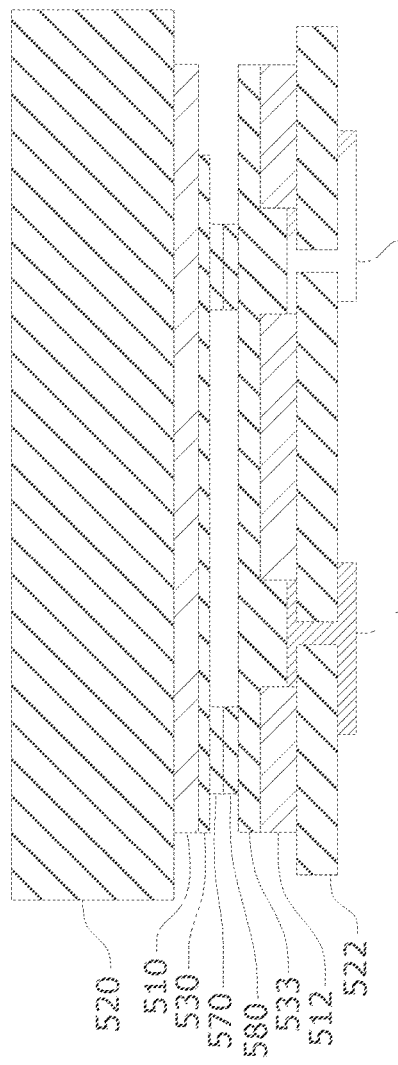
Figure 10D:
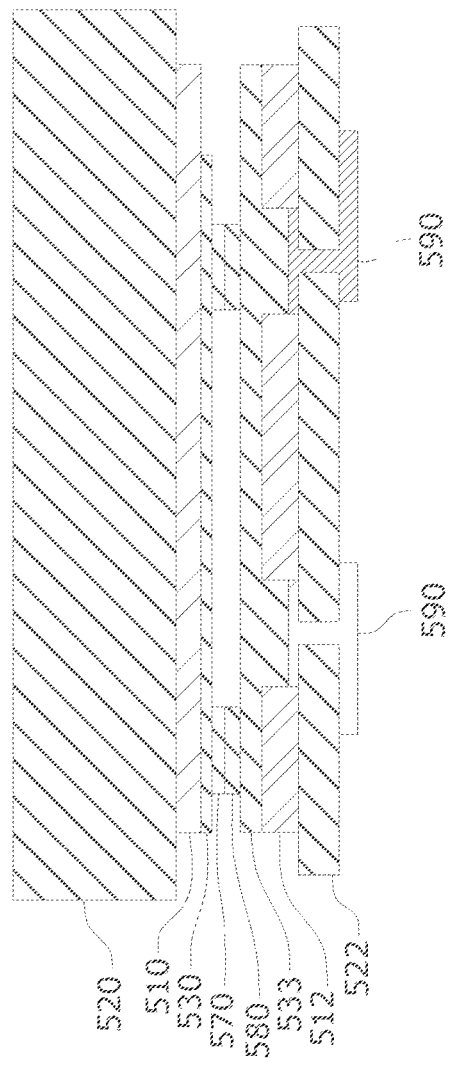
Figure 10D:
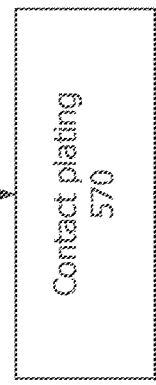
Figure 10D:
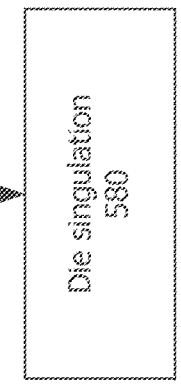

FIG. 6E shows a side schematic view of surface 610, bottom die 630 and top die 640 of filter 600. FIG. 6E shows feature numbers 500-590 that will be further explained in FIGS. 10A-10D and that are shown at step 580 of FIG. 10D. FIG. 6E shows the side view of the layout of the substrate 522, piezoelectric plate 512 and conductor layer (e.g., IDTs) 533 of shunt XBARs Sh11, Sh12, Sh31, Sh32, Sh51, Sh52, Sh71 and Sh72 of die 640; of the substrate 520, piezoelectric plate 510 and conductor layer (e.g., IDTs) 530 of series XBARs Se2, Se4, Se6 and Se8 of die 630; the bottom surface 610 and contact pads 620 (e.g., pads 590).

It shows the conductive vias VS2, VS4, VS6 and VS8, such as contact pads on and between surfaces of die 630 and 640. It shows the conductive vias V1IN and V1OUT, such as TWVs on and between surfaces of die 630 and 640; and through die 630 to pads 620. It shows the conductive vias V11, V12, V31, V32, V51, V52, V71 and V72, such as contact pads on and between surfaces of die 630 and 640; TWVs on and between surfaces of die 630 and 640; and TWVs through die 630 to pads 620.

Each of die 630 and 640 have a substrate (not shown) having the surfaces 632 and 642 and cavities in the substrate (not shown disposed under the XBARs on the surfaces 632 and 642. Each of die 630 and 640, the substrate and/or surfaces 632 and 642 have a single-crystal piezoelectric plate having parallel front and back surfaces, the back surface attached to the surface of the substrate except for a portion of the piezoelectric plate forming a diaphragm that spans these cavities. Each of die 630 and 640, the substrate and/or surfaces 632 and 642 also have an interdigital transducer (IDT) formed on the front surface of the single-crystal piezoelectric plate such that interleaved fingers of the IDT are disposed on the diaphragm, the single-crystal piezoelectric plate and the IDT configured such that a radio frequency signal applied to the IDT excites a shear primary acoustic mode within the diaphragm.

Each of die 630 and 640 may be a thinned die such as by having an original thickness of the substrate polished or otherwise reduced. Each of die 630 and 640 may be or have a substrate that forms a front or lid of the filter 600. Each of die 630 and 640 may be or have a substrate that forms a back of the filter 600.

FIGS. 6A-6E may show a bonded die stack filter 600 having die 630 bonded to die 640 with the surface 642 having the shunt XBARs of die 630 facing the surface 632 having the series XBARs of die 640. Die 640 facing die 630 means die 640 is attached to die 630 a) with the surface 642 closer to surface 632 than to the substrate of die 630 under surface 632, and b) with the surface 632 closer to surface 642 than the substrate of die 640 under surface 632. Facing away means the substrates are closer to each other than the others die's surface.

Conductive vias VS2, VS4, VS6 and VS8 may be wafer bumps or contact plating extending between and electrically connecting the one or more XBARs on the first surface 632 to the one or more XBARs on the second surface 642. Also, between die 630 and 640, vias V1IN, V11, V12, V31, V32, V51, V52, V71, V72 and V1OUT may be wafer bumps or contact plating extending between and electrically connecting the one or more XBARs, signal lines or ground lines on the first surface 632 to the one or more XBARs, signal lines or ground lines on the second surface 642.

The conductive vias VS2, VS4, VS6 and VS8 may be a set of contact pads, wafer bumps or contact plating on die 630 connected to, attached to, bonded to and/or touching a set of contact pads, wafer bumps or contact plating on die 640. The conductive vias VS2, VS4, VS6 and VS8 may be extending between and electrically connecting the shunt XBARs on the surface 632 to the series XBARs on the surface 642.

In some cases, filter 600 is built with die 640 as the bottom or lid die with exposed surface 610 and contacts 620 on die 640 instead of on die 630. In this case, the same concepts as shown herein apply for having the vias of the lid pads 620 extend through filter 600 to XBARs of die 630 and 640.

For example, either die 630 or 640 could be the package lid of filter 600 depending upon where via inductance of the vias of filter 600 has least impact in performance of the filter. The loss and inductance of a via can reduce shunt resonator Q, degrading filter insertion loss and rejection so typically designers would try to minimize via lengths to lower their inductance. In some cases, adding more via inductance can widen filter bandwidth slightly, which can help with process margin. Die 630 or 640 could be selected as the package lid of filter 600 based on the selected die minimizing via length and/or increasing via inductance as compared to using the other die.

Stacking the resonators of die 630 and 640 instead of building a filter with these resonators unstacked (such as by being on one die, chip, wafer or plane) vertically shrinks die or package footprint without reducing resonator sizes and subsequent power handling as compared to unstacked resonators, while using the same resonators used in both filter configurations. One estimate is that stacking reduces the die footprint by 50 percent of unstacked. This reduction allows up to 2 filters 600 with the same performance to be in the footprint of one non-stacked filter.

FIGS. 7A, 7B, 7C, 7D and 7E are top schematic views of a stacked die XBAR resonator filter 700 having series resonators on one die and shunt resonators on two other die. Filter 700 may be a three layer die split ladder package with three stacked die or chips that may exist in a single package. Filter 700 may have the shunt resonators moved onto two separate layers to shrink the filter footprint or surface area from a top perspective.

Figures 7A, 7B:
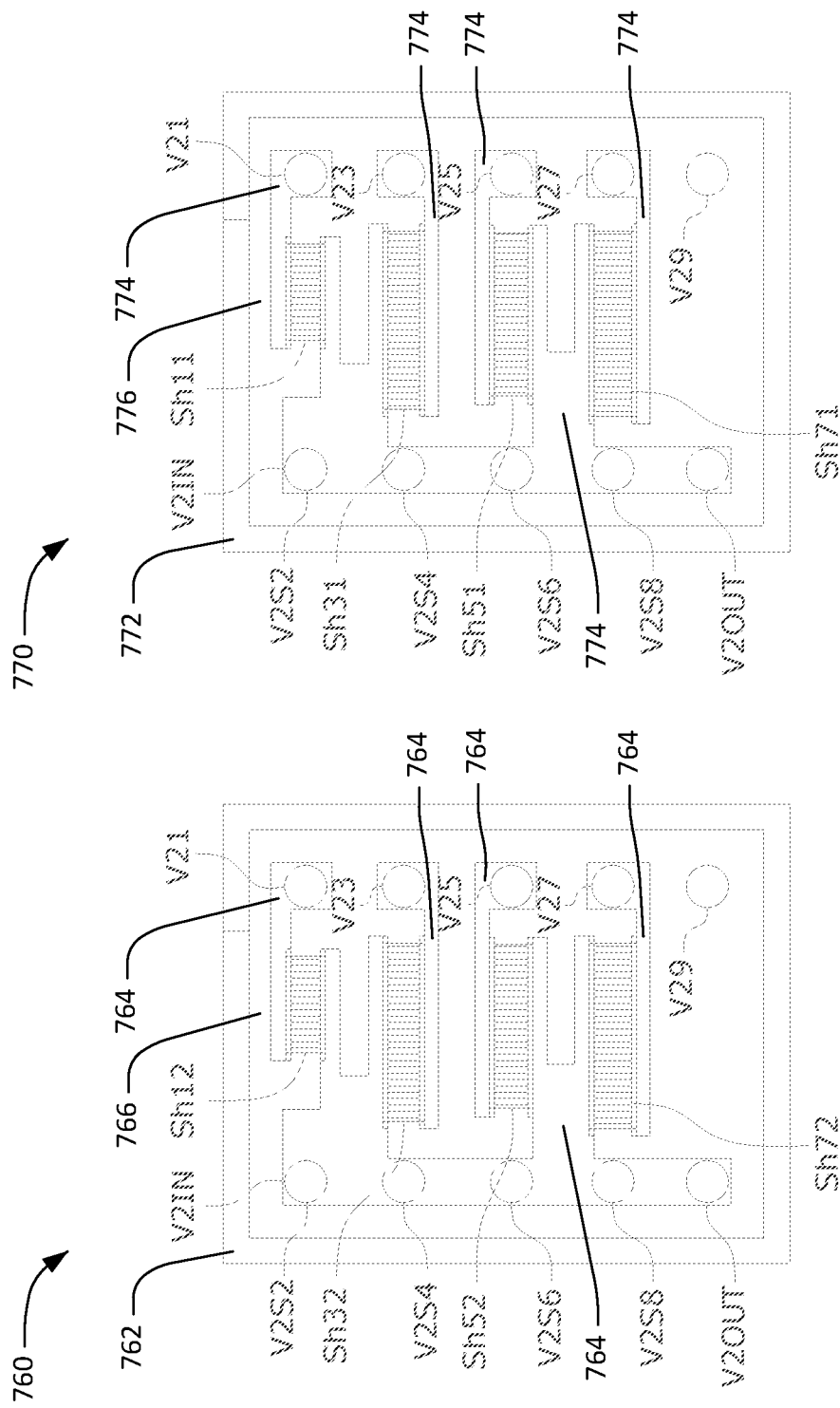
FIGS. 7A, 7B, 7C, 7D and 7E are a stacked die XBAR resonator filter having series resonators on one die and shunt resonators on two other die.

FIG. 7A shows a bottom die 760 of filter 700, the die 760 having the Shx2 half of shunt resonators of die 630 and conductive vias extending through surface 762 and die 760. Die 760 may be or include the package lid 710 (see FIG. 7E) of filter 700. Die 760 may be a shunt resonator die/lid with a piezoelectric plate thickness=T1 and resonance frequency=F1. The resonators in bottom die 760 of filter 700 may have the same function as the corresponding shunt resonators in die 630 of the two layer stack of filter 600. Die 760 may have the same piezo plate thickness and resonant frequencies as die 630.

Die 760 contains or includes shunt XBARs Sh12, Sh32, Sh52 and Sh72, on (e.g., formed in or on) a surface 762. Die 760 contains conductive vias V2IN, V21, V23, V25, V27, V2S2, V2S4, V2S6, V2S8 and V2OUT through surface 762 and to contacts of the lid surface. These vias may be on or extend through: a) surface 762 and/or b) die 760 to die 740 and/or 770 (see FIGS. 7B-7C).

Below die 760, filter 700 may have a package bottom or backside of having a lid surface similar to surface 610 with lid backside-package contacts or contact pads similar to pads 620 for each conductive via.

Die 760 contains conductive vias V2S2, V2S4, V2S6 and V2S8 on surface 762 and connected to die 770 and die 740. Conductive vias V2S2, V2S4, V2S6 and V2S8 may electrically connect XBARs of die 760 to XBARs or conductive vias of die 770 and die 740.

FIG. 7B shows a middle die 770 of filter 700, the die 770 having the Shx1 half of shunt resonators of die 630 and conductive vias extending through surface 772 and die 770. Die 770 may be the package mid layer of filter 700 between die 760 and 740. Die 770 may be a shunt resonator die with a piezoelectric plate thickness=T1 and resonance frequency=F1. The resonators in middle die 770 of filter 700 may have the same function as the corresponding shunt resonators in die 630 of the two layer stack of filter 600. Die 770 may have the same piezo plate thickness and resonant frequencies as die 630. In some cases, the resonators of die 760 and 770 are not the same as those for die 630 because shunt resonators typically have a small range of resonant frequencies and similar frequencies could be combined on each layer of die 760 and 770 to reduce deviation from the native XBAR frequency which is desired because less deviation yields fewer spurs, wider BW and higher Q.

Die 770 contains or includes shunt XBARs Sh11, Sh31, Sh51 and Sh71, on (e.g., formed in or on) a surface 772. Die 770 contains conductive vias V2IN, V21, V23, V25, V27, V2S2, V2S4, V2S6, V2S8 and V2OUT on or through surface 772 and to vias of die 760, die 740 and/or contacts of the lid surface. These vias may extend from or through surface 772 and/or die 770 to die 760 and/or 740 (see FIGS. 7B-7C).

Die 770 contains conductive vias V2S2, V2S4, V2S6 and V2S8 on surface 772 and connected to die 760 and die 740. Conductive vias V2S2, V2S4, V2S6 and V2S8 may electrically connect XBARs of die 770 to XBARs or conductive vias of die 760 and die 740.

Figure 7C:
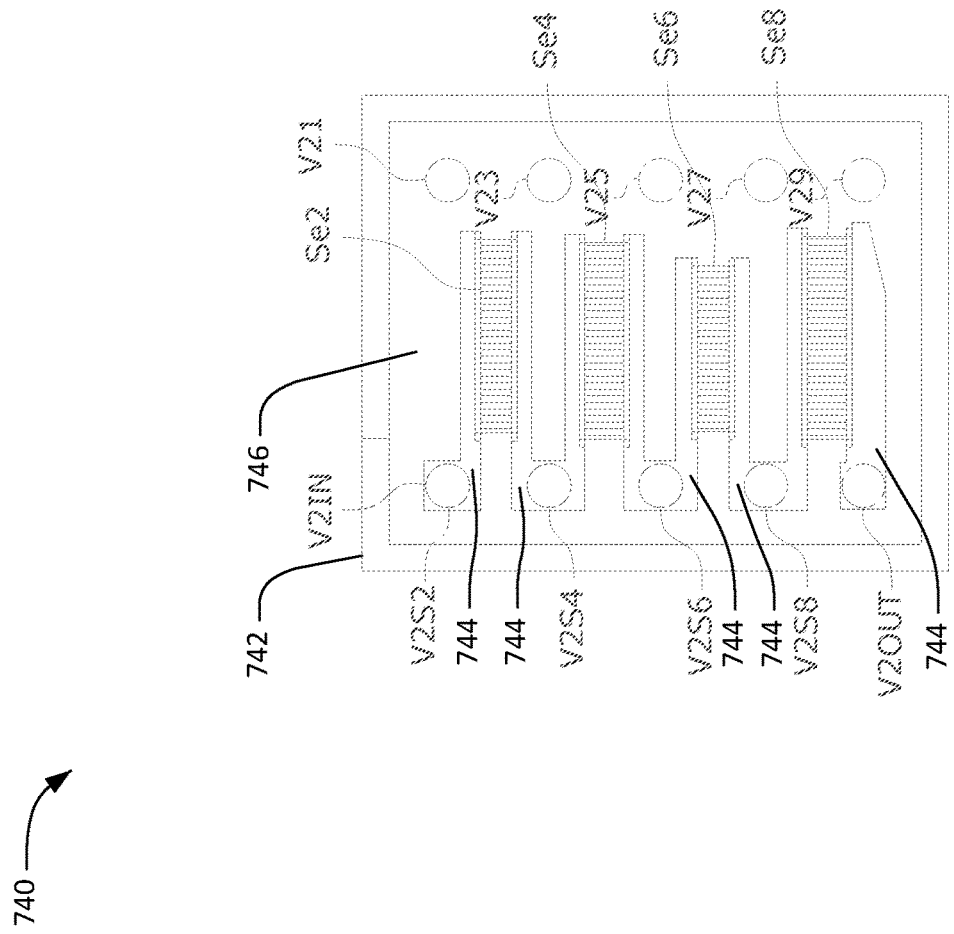

FIG. 7C shows a top die 740 of filter 700, the die 740 having series resonators and conductive vias extending from or through die 740. Die 740 may be the package base or substrate of filter 700. Die 740 may be a series resonator die/back with a piezoelectric plate thickness=T2 and resonance frequency=F2. The resonators in top die 740 of filter 700 may have the same function as the corresponding series resonators in die 640 of the two layer stack of filter 600. Die 740 may have the same piezo plate thickness and resonant frequencies as die 640.

Die 740 contains or includes series XBARs Se2, Se4, Se6 and Se8, on (e.g., formed in or on) a second surface 742. Die 740 contains conductive vias V2IN, V21, V23, V25, V27, V2S2, V2S4, V2S6, V2S8 and V2OUT on or through surface 742 and to vias of die 760, die 770 and/or contacts of the lid surface. These vias may extend from or through surface 742 and/or die 740 to die 760 and/or 770 (see FIGS. 7B-7C).

Die 740 contains conductive vias V2S2, V2S4, V2S6 and V2S8 on surface 742 and connected to die 740 and die 760 and 770. Conductive vias V2S2, V2S4, V2S6 and V2S8 may electrically connect XBARs of die 740 to XBARs or conductive vias of die 770 and die 760.

Figure 7D:
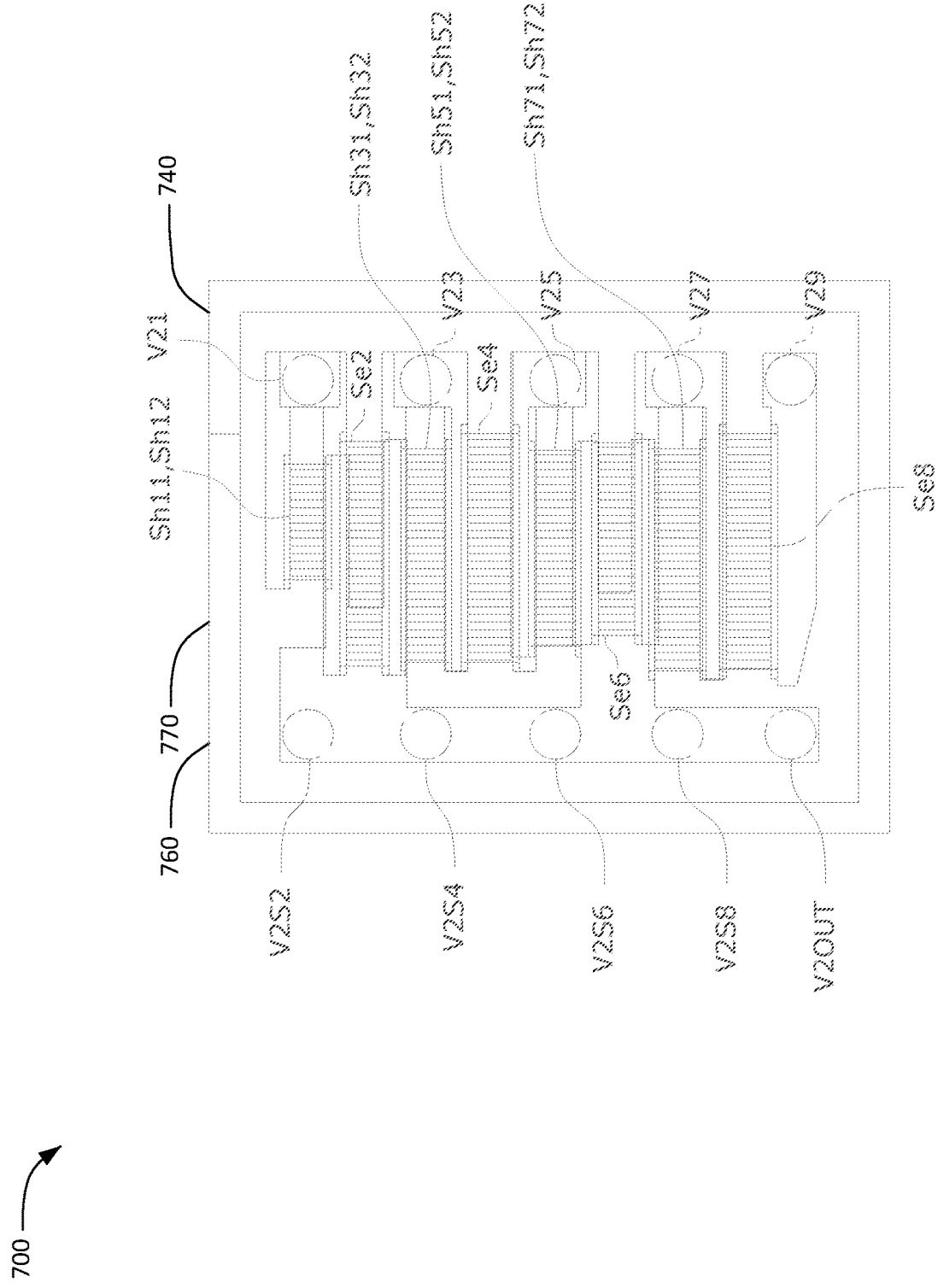
Figure 7E:
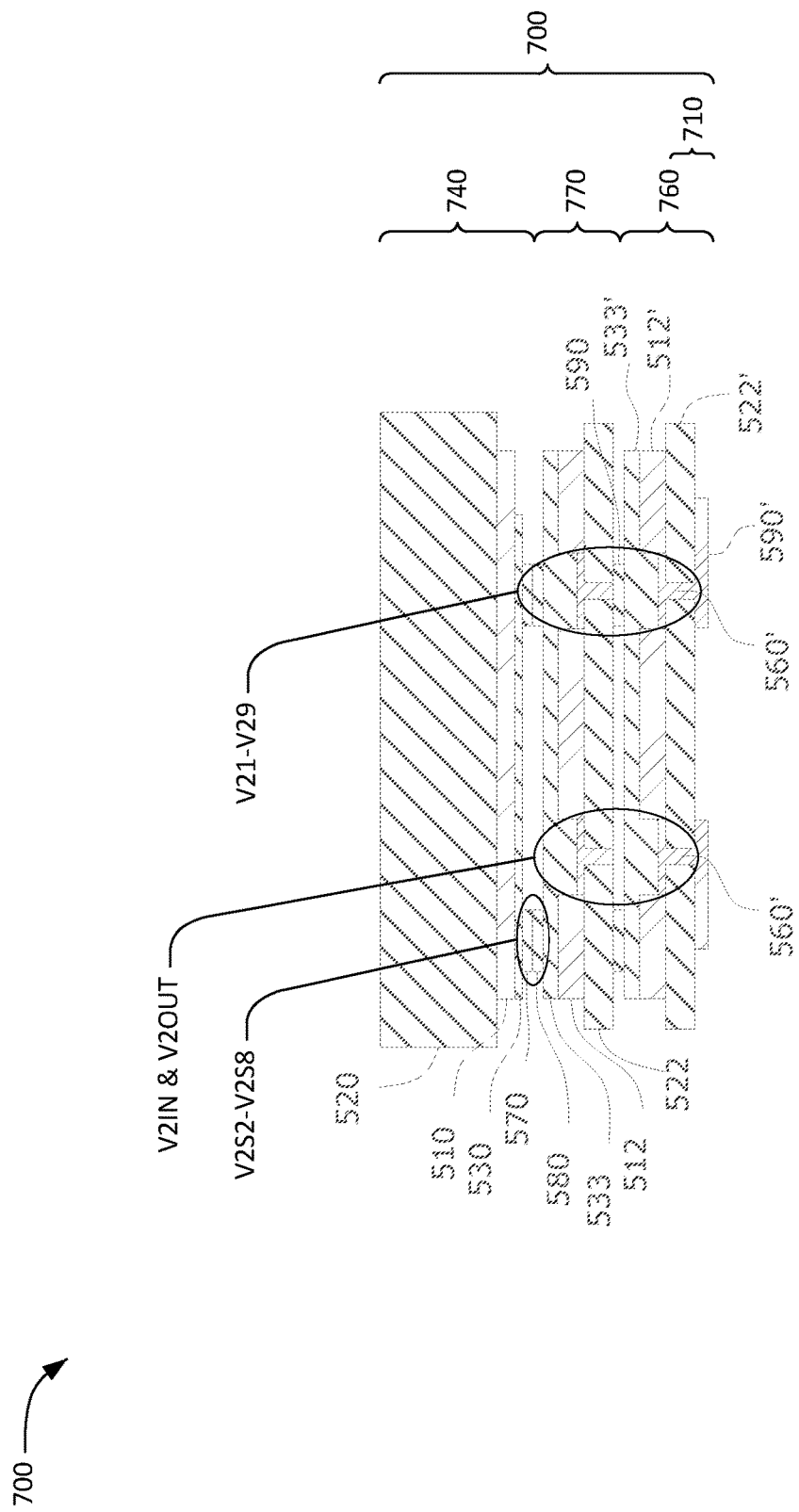

FIGS. 7D-7E show filter 700 with surface 762 and/or vias on that surface bonded to a surface of the substrate and/or vias on the back of die 770; and with surface 772 and/or vias on that surface bonded to surface 742 and/or vias on that surface to create ad three die stack.

FIG. 7D shows a top schematic view of bottom die 760, middle die 770 and top die 740 of filter 700. FIG. 7D shows the top view of the layout of shunt XBARs Sh11, Sh12, Sh31, Sh32, Sh51, Sh52, Sh71 and Sh72; series XBARs Se2, Se4, Se6 and Se8; conductive vias V2IN, V21, V23, V25, V27, V2S2, V2S4, V2S6, V2S8 and V2OUT; and conductive vias V2S2, V2S4, V2S6 and V2S8.

FIG. 7E shows a side schematic view of bottom die 760, middle die 770 and top die 740 of filter 700. FIG. 7E shows feature numbers 500-590 that will be further explained in FIGS. 10A-10D and that are shown at step 580 of FIG. 10D. FIG. 7E shows the side view of the layout of the substrate 522', piezoelectric plate 512' and conductor layer (e.g., IDTs) 533' of shunt XBARs Sh11, Sh31, Sh51 and Sh71 of die 760; of the substrate 522, piezoelectric plate 512 and conductor layer (e.g., IDTs) 533 of shunt XBARs Sh11, Sh31, Sh51 and Sh71 of die 770; of the substrate 520, piezoelectric plate 510 and conductor layer (e.g., IDTs) 530 of series XBARs Se2, Se4, Se6 and Se8 of die 740; and the bottom surface 710 and contact pads 720 (e.g., pads 590').

It shows the conductive vias V2S2, V2S4, V2S6 and V2S8, such as contact pads on and between surfaces of die 760, 770 and 740. It shows the conductive vias V2IN and V2OUT, such as TWVs on and between surfaces of die 760, 770 and 740; and through die 770 and 760 to pads 720. It shows the conductive vias V21, V23, V25 and V27, such as contact pads on and between surfaces of die 760, 770 and 740; TWVs on and between surfaces of die 760 and 770; and TWVs through die 760 and 770 to pads 720.

FIG. 7A-7E may show a bonded die stack filter 700 having die 760 bonded to die 770 which is bonded to die 740, with the surface 762 having the shunt XBARs of die 760 facing the surface 772 having the shunt XBARs of die 770; and the surface 772 having the shunt XBARs of die 770 facing away from the surface 742 having the series XBARs of die 740.

Conductive vias V2S2, V2S4, V2S6 and V2S8 may be wafer bumps or contact plating extending between and electrically connecting the one or more XBARs on the surface 742 to the one or more XBARs on the surface 772. Also, between die 770 and 740, vias V2IN, V21, V23, V25, V27, V2S2, V2S4, V2S6, V2S8 and V2OUT may be wafer bumps or contact plating extending between and electrically connecting the one or more XBARs, signal lines or ground lines on the surface 772 to the one or more XBARs, signal lines or ground lines on the second surface 742. The conductive vias V2S2, V2S4, V2S6 and V2S8 may be a set of contact pads, wafer bumps or contact plating on die 770 connected to, attached to, bonded to and/or touching a set of contact pads, wafer bumps or contact plating on die 740. The conductive vias V2S2, V2S4, V2S6 and V2S8 may be extending between and electrically connecting the shunt XBARs on the surface 772 to the series XBARs on the surface 742.

Between die 770 and 760, vias V2IN, V21, V23, V25, V27, V2S2, V2S4, V2S6, V2S8 and V2OUT may be TWVs extending through surface 772 and die 770 and electrically connecting the one or more XBARs, signal lines or ground lines on the surface 772 to the one or more XBARs, signal lines or ground lines on the second surface 762. These vias may also include a set of contact pads, wafer bumps or contact plating on back or substrate of die 770 connected to, attached to, bonded to and/or touching a set of contact pads, wafer bumps or contact plating on die 760.

The conductive vias V2S2, V2S4, V2S6 and V2S8 may be a set of TWVs through die 770 connected to, attached to, bonded to and/or touching a set of contact pads, wafer bumps or contact plating on die 760. The conductive vias V2S2, V2S4, V2S6 and V2S8 may be extending between and electrically connecting the shunt XBARs on the surface 772 to the shunt XBARs on the surface 762.

Vias V2S2-V2S8 of FIGS. 7A-7E may function the same as vias VS2-VS8 of FIGS. 6A-D. Vias V2x of FIGS. 7A-7E may function the same as the combination of vias Vx1 and Vx2 of FIG. 6A-D. This functionality may also correspond to the via connection mapping in FIG. 5.

Each of die 760, 770 and 740 have a substrate (not shown) having the surfaces 762, 772 and 742 and cavities in the substrate (not shown disposed under the XBARs on the surfaces 762, 772 and 742. Each of die 760, 770 and 740, the substrate and/or surfaces 762, 772 and 742 have a single-crystal piezoelectric plate having parallel front and back surfaces, the back surface attached to the surface of the substrate except for a portion of the piezoelectric plate forming a diaphragm that spans these cavities. Each of die 760, 770 and 740, the substrate and/or surfaces 762, 772 and 742 also have an interdigital transducer (IDT) formed on the front surface of the single-crystal piezoelectric plate such that interleaved fingers of the IDT are disposed on the diaphragm, the single-crystal piezoelectric plate and the IDT configured such that a radio frequency signal applied to the IDT excites a shear primary acoustic mode within the diaphragm.

Each of die 760, 770 and/or 740 may be a thinned die such as by having an original thickness of the substrate polished or otherwise reduced. Each of die 760 or 740 may be or have a substrate that forms a front or lid of the filter 700.

Die 760, 770 and 740 have conductive layer or traces 764, 774 and 744 and insulator or dielectric 766, 776 and 746 between the trances as shown. These traces and dielectric electrically connect the vias and XBARs of these die as shown in FIGS. 5 and 7A-7E. These traces, dielectric and the vias V2S2, V2S4, V2S6 and V2S8 connect the shunt XBARs of die 760 to the shunt XBARs of die 770 and to the series XBARS of die 740 as shown in FIGS. 5 and 7A-7E. These traces, dielectric and the vias V1IN and V1OUT connect the shunt XBARs of die 760 to: a) the shunt XBARs of die 770; b) the series XBARS of die 740; and c) the input and output signal lines of filter 700 as shown in FIGS. 5 and 7A-7E. These traces, dielectric and the vias V21, V23, V25 and V27 connect the shunt XBARs of die 760 and 770 to ground and to each other as shown in FIGS. 5 and 7A-7E.

In some cases, filter 700 is built with die 740 as the bottom or lid die with an exposed surface and contacts instead of on die 760 as the lid die. In this case, the same concepts as shown herein apply for having the vias of the lid pads extend through filter 700 to XBARs of die 760, 770 and 740. For example, either die 760 or 740 could be the package lid of filter 700 depending upon where via inductance of the vias of filter 700 has least impact in performance of the filter. The loss and inductance of a via can reduce shunt resonator Q, degrading filter insertion loss and rejection so typically designers would try to minimize via lengths to lower their inductance. In some cases, adding more via inductance can widen filter bandwidth slightly, which can help with process margin. Die 760 or 740 could be selected as the package lid of filter 700 based on the selected die minimizing via length and/or increasing via inductance as compared to using the other die.

Figure 8:
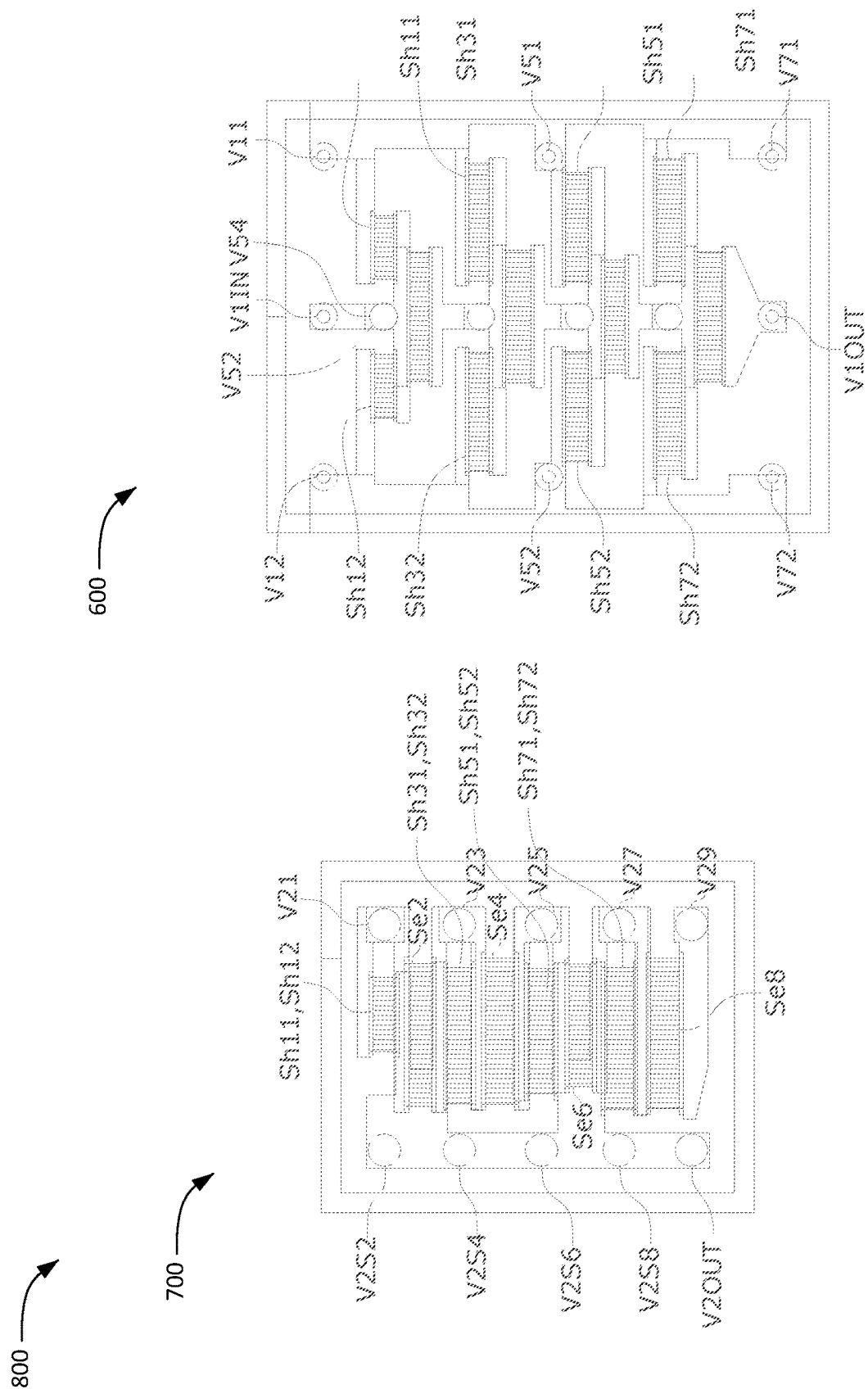
FIG. 8 is a top view of the filters of FIGS. 6D and 7D.

FIG. 8 is a top view 800 of the filters of FIGS. 6 and 7. View 800 shows FIG. 7D to the left of FIG. 6D in order to give a three-layer versus two-layer split ladder footprint size comparison. View 800 shows that the three-layer package is 48% the area of the two layer package, such as where the filter 700 has a footprint of 713×876 um and the filter 600 has a footprint of 1000×1300 um. The smaller footprint of the three-layer package is more desirable because it vertically shrinks die footprint without reducing resonator sizes and subsequent power handling as compared to the two layer stacked resonators, while using the same resonators used in both filter configurations. This reduction allows up to 2 filters 700 with the same performance to be in the footprint of one filter 600.

Stacking the resonators of die 760, 770 and 740 instead of building a filter with these resonators unstacked (such as by being on one die, chip, wafer or plane) vertically shrinks die or package footprint without reducing resonator sizes and subsequent power handling as compared to unstacked resonators, while using the same resonators used in both filter configurations. One estimate is that stacking reduces the die footprint by 75 percent of unstacked. This reduction allows up to 4 filters 700 to be in the footprint of one non-stacked filter with the same performance.

Description of Methods

Figure 9:
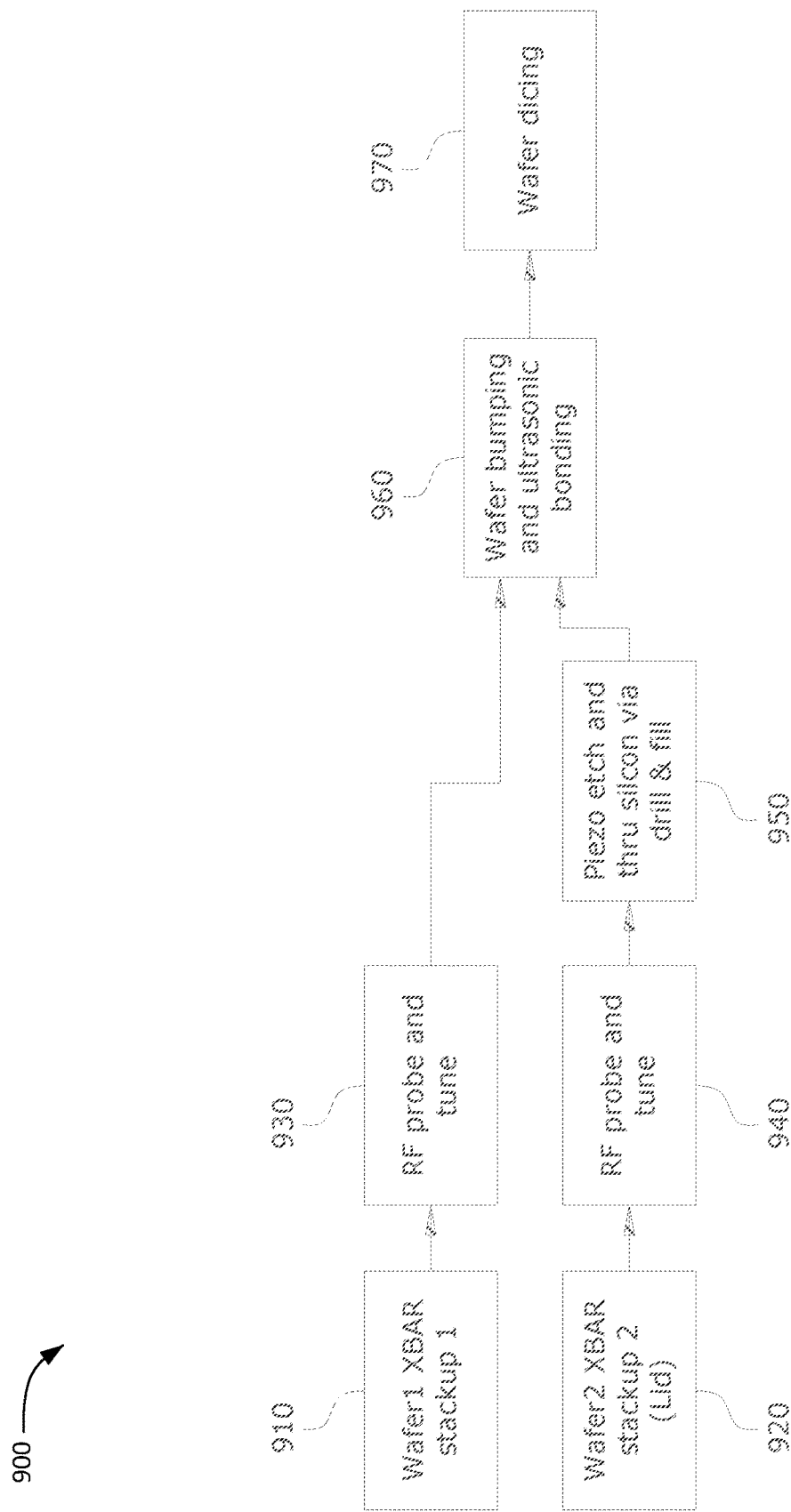
FIG. 9 is a flow chart of a process for fabricating a stacked die XBAR resonator filter.

FIG. 9 is a flow chart of a process 900 for fabricating a stacked die XBAR resonator filter. Process 900 may be fabricating an acoustic resonator device having a plurality of die. The process 900 includes a package assembly flow for an RF bandpass filter. The process 900 may be the forming or may be included in the forming of filter 450, 600 or filter 700. The flow chart of FIG. 9 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 9. The process 900 starts at 910 with wafer 1 containing a plurality of a first XBAR die with a first stackup, and ends after dicing a package at 970 to form a number of completed XBAR RF bandpass filters. For example, the first XBAR die may be the XBAR die 630 and the completed RF bandpass filters may be the filter 600.

At 910, semiconductor processing to form wafer1 XBAR stackup 1 is performed to form a number of XBAR filter die, such as die 640 as noted herein at locations on a wafer. Step 910 may include forming contact pads on the front surface of the die for vias, such as vias V1IN, V11, V12, V31, V32, V51, V52, V71, V72, VS2, VS4, VS6, VS8 and V1OUT. In some cases, only pads for vias V1IN, VS2, VS4, VS6, VS8 and V1OUT are formed.

At 920, semiconductor processing to form wafer2 XBAR stackup 2 is performed to form a number of XBAR filter die, such as die 630 as noted herein at locations on a wafer. Step 920 may include forming contact pads on the front surface of the die for vias, such as vias V1IN, V11, V12, V31, V32, V51, V52, V71, V72, VS2, VS4, VS6, VS8 and V1OUT. In some cases, only pads for vias V1IN, VS2, VS4, VS6, VS8 and V1OUT are formed on the front surface. Step 920 may include forming TWVs on the back surface of the die for vias, such as vias V1IN, V11, V12, V31, V32, V51, V52, V71, V72, VS2, VS4, VS6, VS8 and V1OUT that extend through the die surface, such as surface 610.

Steps 910 and 920 may be XBAR wafer die fabrications to form XBARS described at FIGS. 1-3 that are formed on the surfaces of the die, such as die 640 and 630. For example, steps 910 and 920 include forming IDTs with interleaved fingers on diaphragms formed over cavities of the substrates.

At 930 and 940, the two die of steps 910 and 920 (such as die 640 and die 630) are RF probed and tuned, such as by separately probing, measuring the admittance of and tuning the admittance of each XBAR of the die. Tuning may include adding, thinning or thickening frontside and/or backside dielectric formed on the piezoelectric plate of the XBAR.

At 950, the second of the two die, such as die 630, have their piezoelectric plates etched; substrates etched or drilled to form thru silicon vias through the die; and the vias filled with conductor in the die. Step 950 may be or include forming conductive vias, such as vias V1IN, V11, V12, V31, V32, V51, V52, V71, V72, VS2, VS4, VS6, VS8 and V1OUT. In some cases, only vias V1IN, VS2, VS4, VS6, VS8 and V1OUT are formed. Etching the piezoelectric plate to form the vias may be performed separately from and in addition to other etches of that plate.

In other cases, step 950 may be performed on the first of the two die, such as die 640, to form the vias through that die, as discussed herein.

At 960, wafer bumps are formed on contact pads vias of the first die, such as die 630, of that wafer; and the front surfaces having the contact pads facing each other of the two wafers having the two die (such as die 630 and 640) are ultrasonic bonded together. Step 960 may be attaching front surfaces of die 630 to front surfaces of die 640. In other cases, the bumps are formed on the second die, such as die 640. Bumps may not be formed when other connection or attachment of the contact pads is used, such as by direct contact and heating or other conductive bonding of the pads of the die to each other. Bonding other than ultrasonic may be performed in place of or in addition to the ultrasonic bonding. Step 960 may be or include hard lid bonding. Current hard lid bonding process may use thermocompression bonding with ultrasonics.

Step 960 forms ladder filters, such as filters 600, at the locations of the two bonded die on the wafers. Step 960 may include forming a lid surface and contacts, such as surface 610 and contacts 620. Step 960 electrically connects the conductive vias the XBARs of the first die (such as die 630) to XBARs of the second die (such as die 640) as noted herein.

The steps 910, 920, 950 and 960 may include forming wafer bumps or contact plating extending between and electrically connecting the XBARs of the first and second. These steps may include forming TWVs electrically connecting the XBARs of the first die to ground contact pads and/or circuitry; and forming TWVs electrically connecting the XBARs of the first and second die to input/output signal contact pads and/or circuitry.

At 970, the bonded wafers having the first and second die are diced to separate the ladder filters, such as filters 600. Step 970 may dice the locations on the bonded die wafer that form the filters to separate each of the filters from the others. Additional processing may be performed at step 970 to create chips or packages each having one or more of the filters. Step 970 may be dicing a wafer package to form a number of completed XBAR RF band pass ladder filters, such as filters 600.

Process 900 may be used to form three-layer filters such as the filter 700 instead of two-layer filters such as the filter 600, by including another instance or leg of steps 920, 940 and 950 to form die 770 on one wafer, while the first instance of these three steps forms die 760 on another wafer, both with the vias noted for die 760 and 770. Then at step 960, all three wafers are bonded to form filters 700 at locations on the bonded wafer; and at step 970 the filter 700 are diced from the bonded wafer. Forming die 760 and 770 may include forming conductive vias V2IN, V21, V23, V25, V27, V2S2, V2S4, V2S6, V2S8 and V2OUT of and through die 760 as noted herein; and conductive vias V2IN, V21, V23, V25, V27, V2S2, V2S4, V2S6, V2S8 and V2OUT of and through die 770 as noted herein. In this case, the step 950 and 960 may include forming wafer bumps or contact plating extending between and electrically connecting the XBARs of die 760, 770 and 740. Here, steps 960 may include attaching a front surface of die 760 to a back surface of die 770 and attaching a front surface of die 770 to a front surface of die 740.

FIGS. 10A, 10B, 10C and 10D are a flow chart of a process 1000 for fabricating a stacked die XBAR resonator filter. Process 1000 may be fabricating an acoustic resonator device having a plurality of die. The process 1000 includes a package assembly flow for an exemplary RF bandpass filter. The process 1000 may be the forming or may be included in the forming of filter 450, 600 or filter 700. The flow chart of FIG. 10 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 10. The process 1000 starts at 515 and ends after dicing a package at 580 to form a number of completed XBAR RF band pass filters 600.

At 530, wafer1 LN1 M1 are performed to form piezoelectric plate 510 on substrate 520 and then to form conductor layer having IDT 530 on the plate 510 to form device 501. Step 530 may include or be part of step 910.

At 535, wafer2 LN2 M2 are performed to form piezoelectric plate 511 on substrate 521 and then to form conductor layer having IDT 531 on the plate 511 to form device 502. The structures of step 535 are on a different die, wafer and/or substrate than those of step 530. Step 530 may include or be part of step 920.

Steps 530 and 535 may be respective XBAR piezoelectric plate 510 and 511 and electrode layer 530 and 531 package processing on silicon base wafers 520 and 521 to form XBARS described at FIGS. 1-3 on the surfaces of die 640 and 630, respectively. For example, steps 530 and 535 include forming IDTs with interleaved fingers on diaphragms formed over cavities of the substrates.

At 540, thru wafer vias (TWV) 560 are formed on device 502 and filled with conductive material 550 such as metal to form device 503. Step 540 also includes etching and/or other processing of plate 511 and layer 531 to form openings 550 above the TWVs and thus form plate 512 and layer 532. Step 540 may also include etching and/or other processing of plate 511 and layer 531 to form the XBARs of die 630.

At 545, via plate-up is performed on device 503 to fill openings 550 with conductive material 551 such as metal, thus forming layer 533 over the layer 512 and forming device 504. Step 545 may include electroplating to form the material 551. It may also include polishing layer 533. Steps 540 and 545 may include or be part of step 920 and/or 950.

At 550, wafer bump/contact plating is performed on device 501 to form solder bumps and/or contact pads 570 of conductive material such as metal on layer 530, thus forming device 505. Step 550 may include patterning and etching to form contact pads 570. Device 505 may be die 640.

Step 550 also includes wafer bump/contact plating performed on device 504 to form solder bumps and/or contact pads 580 of conductive material such as metal on layer 533, thus forming device 506. Step 550 may include patterning and etching to form contact pads 580. Device 506 may be die 630. Step 550 may include or be part of step 910, 920 and/or 950.

At 560, wafer ultrasonic bonding is performed on devices 505 and 506 to bond those devices together, thus forming device 507. Step 560 may include flipping device 505 or 506 and aligning the solder bumps and/or contact pads 570 with pads 580. Step 560 may include flip-chip bonding the solder bumps and/or contact pads 570 to pads 580. Step 560 may include or be part of bonding of step 960. Device 507 may be part of device 600.

At 565, lid thinning is performed on device 507 to reduce the thickness of substrate 521, thus forming substrate 522 and device 508. Step 565 may include polishing the bottom surface of substrate 521 at least to the conductor 560 so that the conductor is exposed at the bottom surface. The bottom surface of substrate 522 may be surface 610. Step 565 may include or be part of bonding of step 920 and/or 950.

At 570, contact plating is performed on device 508 to form contact plates 590 on the bottom surface of substrate 522, thus forming device 509. Plates 590 may be formed on and attached to conductor 560. Step 570 may include patterning and etching to form contact plates 590. Plates 590 may be pads 620. Device 509 may be device 600 or a bonded wafer having devices 600 prior to dicing as noted at process 900. Step 570 may include or be part of step 920 and/or 950.

At 580, die singulation is performed on device 509 to separate ones of filter 600 from other ones of filter 600, thus forming device 510. Step 580 may include wafer dicing a bonded wafer having devices 600 as noted at step 970 of process 900. Device 510 is device 600.

Process 1000 may be used to form filters 700 instead of 600 by including another instance or set of steps 535, 540, 545 and 550 to form die 770 on one wafer, while the first instance of these six steps form die 760 on another wafer, both with the vias noted for die 760 and 770. Then at a first of steps 560 and 565, die 770 is bonded to die 740; and die 770 is thinned. Then at another of steps 560 and 565 die 776 is bonded to die 770 and 740; and die 760 is thinned. Then, at steps 570 and 580 the contact plates 720 are formed and the filters 700 are diced from the bonded wafer.

Although the description herein relate to an XBAR filter, the same concepts can be applied to a filter that each of one, some or all of the XBARs with a surface acoustic wave resonator (SAW), a bulk acoustic wave (BAW) resonator, a film bulk acoustic wave (FBAW) resonator, a temperature compensated surface acoustic wave resonator (TC-SAW), or a solidly-mounted transversely-excited film bulk acoustic resonator (SM-XBAR). They could also be any of a number of combinations of these types of resonators.

Also, although some embodiments described herein are for filters having 4 series and 8 shunt resonators, the concepts described can be applied to filters having one shunt resonator instead of the pairs, having fewer or more than 4 series resonators and having fewer or more than 4 shunt resonator pair (or single shunt resonators). For example, the concept can be applied to filter 400.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A stacked die XBAR filter device comprising:
    a first die containing one or more shunt XBARs on a first surface, the one or more shunt XBARs having a first piezoelectric layer with a first thickness T1 and a first interdigital transducer having interleaved fingers on the first piezoelectric layer;
    a second die containing one or more series XBARs on a second surface, the one or more series XBARs having a second piezoelectric layer with a second thickness T2 that is less than the first thickness T1 and a second interdigital transducer having interleaved fingers on the second piezoelectric layer; and
    one or more conductive vias through either the first die or the second die,
    wherein the first die is connected to the second die with the first surface facing the second surface, and
    wherein the interleaved fingers of the first interdigital transducer have a different thickness than the interleaved fingers of the second interdigital transducer.

2. The filter device of claim 1, wherein the one or more conductive vias include wafer bumps or contact plating extending between and electrically connecting the one or more shunt XBARs on the first surface to the one or more series XBARs on the second surface.

3. The filter device of claim 2, wherein the one or more conductive vias include:
    first through wafer vias (TWVs) for electrically connecting at least some of the one or more series XBARs to input and output signal external circuitry, and
    second TWVs for electrically connecting the one or more shunt XBARs to ground.

4. The filter device of claim 1, wherein:
    a first conductive via of the one or more conductive vias electrically connects the one or more shunt XBARs to the one or more series XBARS,
    a second conductive via of the one or more conductive vias electrically connects the one or more shunt XBARs to ground, and
    a third conductive via of the one or more conductive vias electrically connects at least some of the one or more series XBARs to external circuitry.

5. The filter device of claim 1, wherein:
    the first die further comprises a first substrate having the first surface and first cavities in an intermediate layer of the first substrate that are disposed under the one or more shunt XBARS,
    the second die further comprises a second substrate having the second surface and second cavities in an intermediate layer of the second substrate that are disposed under the one or more series XBARs, and
    the one or more conductive vias are through either the first substrate or the second substrate.

6. The filter device of claim 5,
    wherein the one or more shunt XBARs and the one or more series XBARs each include the respective piezoelectric layer having a portion that forms a diaphragm that is over the first cavities or the second cavities,
    wherein the respective interdigital transducer is on a surface of the respective piezoelectric layer and the interleaved fingers are on the respective diaphragm, and
    wherein the piezoelectric layer and the interdigital transducer are configured such that a radio frequency signal applied to the interdigital transducer excites a primarily shear acoustic mode within the respective diaphragm.

7. The filter device of claim 5, wherein:
the conductive vias are through the second die,
the second substrate is thinned,
the second die forms a lid of the filter device,
the first substrate forms a back of the filter device.

8. The filter device of claim 1, further comprising:
a third die containing one or more XBARs on a third surface; and
one or more conductive vias through the second die or the third die for electrically connecting the second die to the third die,
wherein the second die is connected to the third die with the second surface facing away from the third surface.

9. A stacked die XBAR filter device, comprising:
a first piezoelectric layer having a first thickness T1 between first front and back surfaces, the first back surface attached to a surface of a first substrate, portions of the first piezoelectric layer forming one or more first diaphragms that are over respective cavities in an intermediate layer of the first substrate;
a first conductor pattern on the first front surface, the first conductor pattern including a first plurality of interdigital transducers (IDTs) of a respective first plurality of acoustic resonators, first interleaved fingers of each of the plurality of first IDTs disposed on one of the one or more first diaphragms;
a second piezoelectric layer having a second thickness T2 between second front and back surfaces, the second back surface attached to a surface of a second substrate, portions of the second piezoelectric layer forming one or more second diaphragms that are over respective cavities in an intermediate layer of the second substrate;
a second conductor pattern on the second front surface, the second conductor pattern including a second plurality of interdigital transducers (IDTs) of a respective second plurality of acoustic resonators, second interleaved fingers of each of the plurality of second IDTs disposed on one of the one or more second diaphragms; and
one or more conductive vias through the first substrate,
wherein the first conductor pattern is connected to the second conductor pattern with the first front surface facing the second front surface,
wherein the second thickness T2 of the second piezoelectric layer is different than the first thickness T1 of the first piezoelectric layer, and
wherein the first interleaved fingers of each of the plurality of first IDTs has a different thickness than the second interleaved fingers of each of the plurality of second IDTs.

10. The filter device of claim 9, wherein the first and second piezoelectric layer and all of the first and second IDTs are configured such that a respective radio frequency signal applied to each first and second IDT excites a respective primarily shear acoustic mode within the respective diaphragm.

11. The filter device of claim 9, wherein:
the first acoustic resonators are shunt acoustic resonators of a ladder circuit,
the second acoustic resonators are series acoustic resonators of the ladder circuit, and
wherein the second thickness T2 of the second piezoelectric layer is less than the first thickness T1 of the first piezoelectric layer.

12. A method of fabricating an acoustic resonator device having a plurality of dies, the method comprising:
forming one or more conductive vias through a first die, the first die having a plurality of shunt XBARs on a first surface, the plurality of shunt XBARs having a first piezoelectric layer with a first thickness T1 and a first interdigital transducer having interleaved fingers on the first piezoelectric layer; and
attaching a front surface of first die to a front surface of a second die, the second die having a plurality of series XBARs on a second surface, the plurality of series XBARs having a second piezoelectric layer with a second thickness T2 that is less than the first thickness T1 and a second interdigital transducer having interleaved fingers on the second piezoelectric layer,
wherein the one or more conductive vias electrically connect the first XBARs to the second XBARs, and
wherein the interleaved fingers of the first interdigital transducer have a different thickness than the interleaved fingers of the second interdigital transducer.

13. The method of claim 12, wherein the attaching of the front surface of first die
includes:
attaching bumps or contact pads of the die to bumps or contact pads of the second die; and
ultrasonic bonding of the first die to the second die.

14. The method of claim 12, further comprising:
forming the shunt XBARs on the first surface by forming the first interdigital transducer with the first interleaved fingers on first diaphragms formed over a first cavities of a first substrate; and
forming the series XBARs on the second surface by forming the second interdigital transducer with the second interleaved fingers on second diaphragms formed over a second cavities of a second substrate.

15. The method of claim 12, wherein forming the one or more conductive vias includes:
forming wafer bumps or contact plating extending between and electrically connecting the plurality of shunt XBARs to the plurality of series XBARS,
forming first through wafer vias (TWVs) for electrically connecting at least some of the plurality of series XBARs to external circuitry, and
forming second TWVs for electrically connecting the plurality of shunt XBARS to ground.

16. The method of claim 15, wherein forming the wafer bumps or contact plating extending between and electrically connecting the plurality of shunt XBARs to the plurality of series XBARs includes:
forming conductive vias that electrically connect the plurality of shunt XBARs to the plurality of series XBARs.

17. The method of claim 12, further comprising:
forming one or more second conductive vias through the second die; and
attaching a front surface of a third die to a back surface of the second die, the third die having a plurality of XBARs and a third surface,
wherein the one or more second conductive vias electrically connect the plurality of shunt XBARs, the plurality of series XBARs and the plurality of XBARs of the third die.

18. The filter device of claim 1, wherein the second piezoelectric layer is formed of a different material than the first piezoelectric layer.

19. The filter device of claim 9, wherein the second piezoelectric layer is formed of a different material than the first piezoelectric layer.

\* \* \* \* \*